United States Patent
James et al.

(10) Patent No.: US 7,117,300 B1
(45) Date of Patent: Oct. 3, 2006

(54) METHOD AND APPARATUS FOR RESTRICTED SEARCH OPERATION IN CONTENT ADDRESSABLE MEMORY (CAM) DEVICES

(76) Inventors: David V. James, 3180 South Ct., Palo Alto, CA (US) 94306; Jagadeesan Rajamanickam, 1076 Whitebick Dr., San Jose, CA (US) 95129; Michael C. Stephens, Jr., 2364 Stratford Dr., San Jose, CA (US) 95124

( * ) Notice: Subject to any disclaimer, the term of this patent is extended or adjusted under 35 U.S.C. 154(b) by 337 days.

(21) Appl. No.: 10/281,814

(22) Filed: Oct. 28, 2002

Related U.S. Application Data

(60) Provisional application No. 60/343,973, filed on Dec. 27, 2001.

(51) Int. Cl.
*G06F 12/00* (2006.01)
(52) U.S. Cl. ...................................... 711/108
(58) Field of Classification Search ................ 711/108; 365/49
See application file for complete search history.

(56) References Cited

U.S. PATENT DOCUMENTS

| | | | |
|---|---|---|---|
| 5,956,336 A * | 9/1999 | Loschke et al. ............ 370/392 |
| 6,108,747 A | 8/2000 | Kaganol | |
| 6,175,514 B1 * | 1/2001 | Henderson et al. ........... 365/49 |
| 6,226,710 B1 * | 5/2001 | Melchior ..................... 711/108 |
| 6,374,325 B1 | 4/2002 | Simpson et al. | |
| 6,389,507 B1 * | 5/2002 | Sherman ..................... 711/108 |
| 6,467,020 B1 | 10/2002 | Stilkol et al. | |
| 6,538,911 B1 | 3/2003 | Allan et al. | |
| 6,542,391 B1 | 4/2003 | Pereira et al. | |
| 6,553,453 B1 | 4/2003 | Gibson et al. | |
| 6,744,652 B1 | 6/2004 | Srinivasan et al. | |
| 6,763,425 B1 * | 7/2004 | Pereira ....................... 711/108 |

OTHER PUBLICATIONS

Microsoft Computer Dictionary, 5th edition, Microsoft Press, 2002, pp. 125—content-addressed storage; 247—Hash2.*
U.S. Appl. No. 10/264,667, James et al.

* cited by examiner

*Primary Examiner*—Pierre Bataille
*Assistant Examiner*—Sheng-Jen Tsai
(74) *Attorney, Agent, or Firm*—Bradley T. Sako

(57) ABSTRACT

According to an embodiment, a content addressable memory (CAM) device (104) may be capable of executing a "restricted" search operation. A restricted search operation (an "explore" or "search beyond" operation) may compare only a portion of the CAM entries to a search key device. Preferably, a restricted search operation may restrict searches to entries having an index value greater than a received search index value.

13 Claims, 17 Drawing Sheets

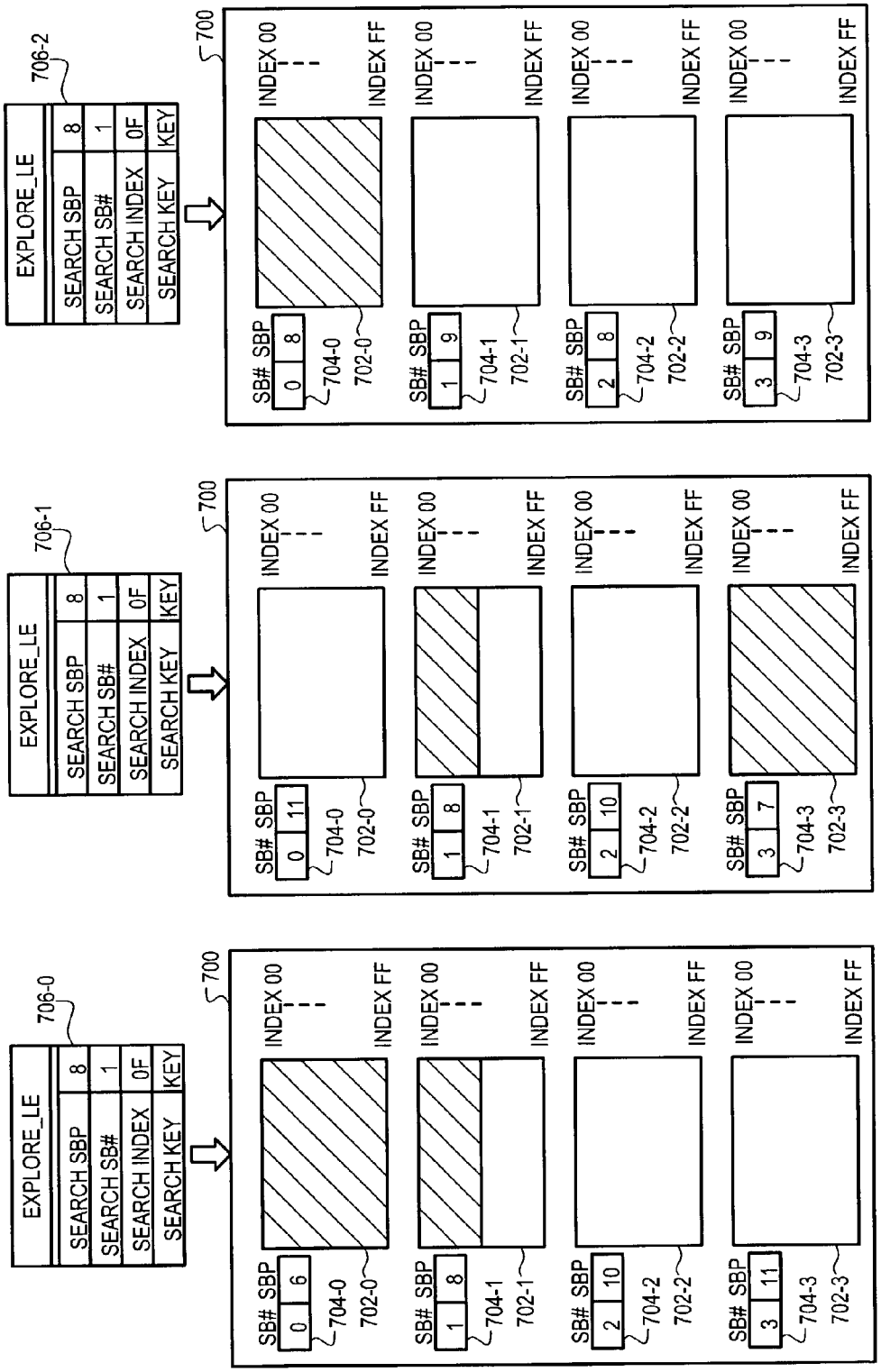

| EXPLORE_LE | | | | |
|---|---|---|---|---|
| No. | OFFSET | SOFT PRIORITY | # MATCH | STATUS |
| — | — | LT | >1 | MATCH2 |
| — | — | LT | =1 | MATCH1 |
| EQ | GT | EQ | >1 | MATCH2 |
| EQ | GT | EQ | =1 | MATCH1 |
| GT | — | EQ | >1 | MATCH2 |
| GT | — | EQ | =1 | MATCH1 |
| LT | — | EQ | — | NO MATCH DATA |
| — | — | GT | — | NO MATCH DATA |
| — | — | — | 0 | NO MATCH DATA |
FIG. 8A
| EXPLORE_EQ | | | | |
|---|---|---|---|---|
| No. | OFFSET | SOFT PRIORITY | # MATCH | STATUS |
| EQ | GT | EQ | >1 | MATCH2 |
| EQ | GT | EQ | =1 | MATCH1 |
| GT | — | EQ | >1 | MATCH2 |
| GT | — | EQ | =1 | MATCH1 |
| — | — | — | 0 | NO MATCH DATA |
FIG. 8B
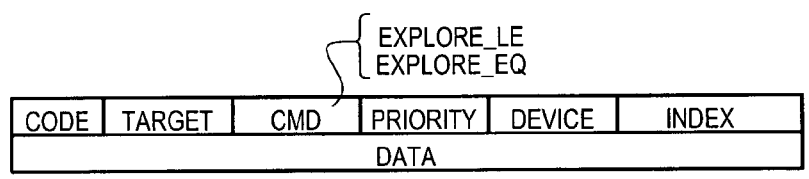
FIG. 9A
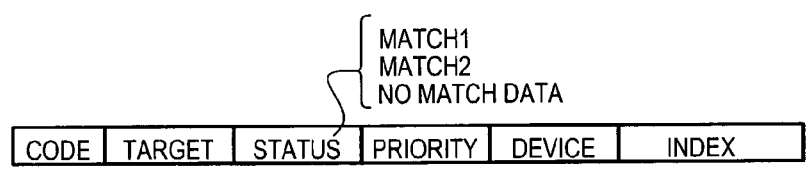
FIG. 9B

| INDEX_IN I2 I1 I0 | DEC7 | DEC6 | DEC5 | DEC4 | DEC3 | DEC2 | DEC1 | DEC0 |
|---|---|---|---|---|---|---|---|---|
| 0 0 0 | 0 | 0 | 0 | 0 | 0 | 0 | 0 | 1 |
| 0 0 1 | 0 | 0 | 0 | 0 | 0 | 0 | 1 | 1 |
| 0 1 0 | 0 | 0 | 0 | 0 | 0 | 1 | 1 | 1 |
| 0 1 1 | 0 | 0 | 0 | 0 | 1 | 1 | 1 | 1 |
| 1 0 0 | 0 | 0 | 0 | 1 | 1 | 1 | 1 | 1 |
| 1 0 1 | 0 | 0 | 1 | 1 | 1 | 1 | 1 | 1 |
| 1 1 0 | 0 | 1 | 1 | 1 | 1 | 1 | 1 | 1 |
| 1 1 1 | 1 | 1 | 1 | 1 | 1 | 1 | 1 | 1 |

HIGHEST PRIORITY ↓ LOWEST PRIORITY

METHOD AND APPARATUS FOR RESTRICTED SEARCH OPERATION IN CONTENT ADDRESSABLE MEMORY (CAM) DEVICES

This application claims the benefit of provisional application Ser. No. 60/343,973 filed Dec. 27, 2001.

TECHNICAL FIELD

The present invention relates generally to content addressable memory (CAM) devices and particularly to search operations and circuits for CAM devices.

BACKGROUND OF THE INVENTION

Due to the increasing need for rapid matching capabilities, in networking hardware equipment for example, content addressable memories (CAMs) continue to proliferate. A CAM may perform matching functions by applying a search key or "comparand" to a table of stored data values. A CAM may then determine if any of the data values match a given search key.

CAM devices may take a variety of forms. As but a few of the possible examples, some CAM devices are based on particular types of CAM cells. Such cells may include storage circuits integrated with compare circuits. Examples of storage circuits may be static random access memory (SRAM) type cells or dynamic RAM (DRAM) type cells. Alternate approaches may include RAM arrays, or the like, with separate matching circuits and/or matching processes executed by a processor, or the like.

Conventional CAM devices may include both binary and ternary CAM devices. Binary CAM devices can provide a bit-by-bit comparison between a stored data value and a key. Ternary CAM devices can provide maskable compare operations that can selectively exclude predetermined bits of a data value from a compare operation.

Typically, a conventional CAM device can generate match indications for each entry. That is, each entry can be compared with an applied search key value. If a search key value matches a stored data value, a match (or "hit") indication may be generated for the entry. Conversely, if a key value does not match a stored data value, a mismatch (or "miss") indication may be generated for the entry.

Match results in a CAM device may include single match results, that can be generated when a single entry matches an applied key value, as well as multiple match results, that may be generated when a more than one entry matches an applied key value.

Conventionally, when a CAM device generates multiple match results, a priority encoder, or the like, can prioritize from among such multiple matches and output an indication corresponding to a single match entry. Typically, priority from among multiple matching entries can be established according to entry address (e.g., lowest address corresponds to highest priority).

While a priority encoder, or the like, can select from among multiple matching entries, it can be desirable to identify other lower priority matching entries. A conventional approach to identifying lower priority addresses in a multiple match case will now be described.

Referring now to FIGS. 21A–21C, a conventional content addressable memory (CAM) device is set forth and designated by the general reference character 2100. A conventional CAM device 2100 may include a number of entries 2102-0 to 2102-*n*, each for storing data values for comparison with a search key value. A CAM device 2100 may also include a match bit 2104-0 to 2104-*n* corresponding to each entry (2102-0 to 2102-*n*). The function of match bits (2104-0 to 2104-*n*) will be described in more detail below.

Entries (2102-0 to 2102-*n*) may each generate a match indication M0 to Mn. Match indications (M0 to Mn) can indicate when data values in a corresponding entry (2102-0 to 2102-*n*) match an applied search key value. Match indications may be prioritized and encoded into an index value by a priority encoder 2110.

A search key value KEY may be applied to entries (2102-0 to 2102-*n*) from a search key input 2106. Along with a search key, a key match bit 2108 may be applied to match bits (2104-0 to 2104-*n*) of entries (2102-0 to 2102-*n*). Conventionally, match bits (2104-0 to 2104-*n*) can function in the same way as a data value bit within an entry. If a key match bit 2108 does not match a match bit (2104-0 to 2104-*n*) a match indication can be forced to a "miss" state. Thus, in the conventional arrangement of FIGS. 21A to 21C, a match indication can be in a "hit" state when both a data value and a corresponding match bit for the entry matches a search key value and key match bit, respectively.

In FIG. 21A it is assumed that an applied search key value KEY matches data values stored in entries 2102-1, 2102-3 and 2102-4. In addition, prior to the application of a search key value KEY, such as while writing or reading the data values initially, match bits (2104-0 to 2104-*n*) can all be set to a same value as key match bit 2108. Thus, such match bits (2104-0 to 2104-*n*) may not generate a mismatch indication. Consequently, a CAM device 2100 may have a multiple match state, shown by match indications M1, M3 and M4 having a "HIT" status.

A priority encoder 2110 may prioritize resulting multiple match indications. In FIGS. 21A to 21C it will be assumed that physical priority is established with entry 2102-0 having a highest priority and entry 2102-*n* having a lowest priority. Accordingly, active match indication M1 can be encoded into an index value INDEX1.

In the conventional approach shown in FIGS. 21A to 21C, following the generation of multiple "HIT" match indications, match bits for all but he highest priority matching entry and a key match bit 2108 can be changed to differ from match bits of non-matching entries. This is illustrated in FIG. 21B by match bits for lower priority matching entries 2104-3 and 2104-4, and key match bit 2108 being changed from a "1" to a "0".

A subsequent search may then be performed with new match bit and key match bit values. This is shown in FIG. 21C.

In FIG. 21C, a same key value KEY as shown in FIG. 21A may be applied from a key input 2106 to entries (2102-0 to 2102-*n*). In addition, a key match bit 2108 may be applied to match bits (2104-0 to 2104-*n*). Due to a change in match bit values and a key match bit value as noted above, non-matching entries and a highest priority entry are prevented from generating "HIT" match indications. Consequently, a second highest priority active match indication M3 may be prioritized and encoded by priority encoder 2110 to generate an index value INDEX3. In this way, a next higher priority match result for a multiple match case may be extracted.

A conventional search operation may continue by changing match bit 2104-3 from a "0" to a "1" and then searching once again with a same search key and key match bit value. Such a search may result in third highest priority match indication M4 being encoded into an in index value INDEX4 (not shown). Such an operation may continue in this fashion until all match results are extracted.

A drawback to the conventional approach noted above can be added time in executing the function and/or added complexity in circuits. In particular, multiple additional write operations may be necessary to set match bits in matching entries and to set a key match bit. In addition, a write operation may be necessary to set the match bit of each matching entry as lower priority matches are extracted.

Yet another drawback to such a conventional approach can be lack of flexibility in operation. In order to extract multiple match results, the state of the conventional CAM is essentially monopolized by the process. That is, while multiple match values are extracted other search operations may not be performed as the setting of a key match bit can prevent a search of non-matching entries and/or higher priority entries that have been previously extracted.

In light of the above, it would be desirable to arrive at some way of extracting multiple match results that may be more flexible and/or faster than conventional approaches.

Additionally, it is always desirable to provide new search features in a CAM device for targeting searches to smaller search spaces (e.g., fewer numbers of entries). Such restricted search approaches may yield results faster than conventional approaches that do not restrict a search space. In addition or alternatively, restricting a search space may reduce power consumption by excluding some entries from search operations.

SUMMARY OF INVENTION

The present invention may include a search method for a content addressable memory (CAM) device having a number of CAM entries. Such a search method may include searching at least one portion of the CAM entries according to a CAM entry identifier (e.g., a search index value). A CAM entry identifier may distinguish portions (e.g., groups) of the CAM entries from other different portions of the CAM entries.

According to one aspect of the embodiments, in a search method a CAM entry identifier can include a search index value. A search index value can correspond to one of the CAM entries.

According to another aspect of the embodiments, a search method may include searching a portion of the CAM entries with a search key value. Such a search key value can be compared to data values in the CAM entries According to another aspect of the embodiments, in a search method a search index value can correspond to a CAM entry having a data value that matched a search key in a previous search operation. Alternatively, a search index value may be an arbitrary index value.

According to another aspect of the embodiments, in a search method CAM entry portions can include a first portion with corresponding index values that are less than or equal to a search index value, and a second portion with corresponding index values that are greater than the search index value.

According to another aspect of the embodiments, in a search method, searching a portion of the CAM entries can include comparing a search information value with a section information value associated with the one portion of the CAM entries to generate a compare result. Such a searching may also include searching the portion of the CAM entries with a search key value when the compare result has a predetermined value.

According to another aspect of the embodiments, in a search method, a compare result can be selected from the group of: equal to, less than, greater than, less than or equal to, greater than or equal to.

According to another aspect of the embodiments, in a search method a search information value can be a search priority value and section information value can be a programmable priority value that indicates a priority of one portion of the CAM entries with respect to other portions of the CAM entries.

According to another aspect of the embodiments, in a search method, the entries of one portion of CAM entries have a priority with respect to one another. In addition, a search method may also include generating a new CAM entry identifier that corresponds to a highest priority matching entry in a portion of the CAM entries.

According to another aspect of the embodiments, a search method may also include generating match results for entries that match an applied search key value in one portion of the CAM entries. Further, a search method may also include searching a second portion of the CAM entries that has fewer entries than the one portion of the CAM entries. The second portion of the CAM entries can be determined according to a highest priority match result from the generated match results.

It is noted that a search method may include initially searching only a portion of the CAM entries (e.g., executing a restricted search).

The present invention may also include a content addressable memory (CAM) device. Such a CAM device may include an entry disable circuit coupled to a number of CAM entries. An entry disable circuit can selectively disable a portion of the CAM entries according to an entry identifier (e.g., an index value). An entry identifier can correspond to one of the CAM entries.

According to one aspect of the embodiments, a CAM device may also include a priority decoder that generates an index value for a highest priority enabled CAM entry having data that matches an applied search key. Further, an entry identifier can correspond to one of the index values.

According to another aspect of the embodiments, in a CAM device, each CAM entry can be accessed according to a CAM address. Further, an entry identifier can include one of the CAM addresses. Still further, an entry disable circuit can include a CAM address decoder that can activate different predetermined address lines in response to each CAM address.

According to another aspect of the embodiments, in a CAM device an entry disable circuit can provide an enable signal to each CAM entry. An entry enable circuit may also include a string decoder that deactivates enable signals for one portion of the CAM entries and activates the enable signals for a different portion of the CAM entries according to an activated address line.

According to another aspect of the embodiments, a CAM device may also include a compare circuit that that compares a section value associated with the plurality of CAM entries to a search related value to generate a comparison result.

The present invention may also include a CAM having a restricted search mode that includes a first subset of the CAM having an enabled search key match function and a second subset of the CAM having a disabled search key match function.

According to one aspect of the embodiments, a CAM device may also include a first subset of the CAM being determined by comparison of a soft-priority level of a memory segment against an incoming command soft-priority level.

According to another aspect of the embodiments, a CAM device may also include a first subset of the CAM being determined by dividing a memory segment based on the incoming command-supplied index.

According to another aspect of the embodiments, a CAM device may also include a second subset of the CAM being determined by CAM entries excluded from a first subset of the CAM.

BRIEF DESCRIPTION OF THE DRAWINGS

FIGS. 7A to 7E are a block diagrams showing "explore" operations according to an embodiment.

FIGS. 8A and 8B are tables illustrating "explore" operations shown in FIGS. 7A to 7E.

FIGS. 9A and 9B are block diagrams showing formats for a request and response according to an embodiment.

DETAILED DESCRIPTION OF THE EMBODIMENTS

Various embodiments of the present invention will now be discussed in conjunction with a number of figures. The embodiments set forth methods and apparatus of restricted search operations for a CAM device or the like. In a restricted search operation a portion of the CAM entries within a CAM device may be excluded from a search operation.

Figure 1A:
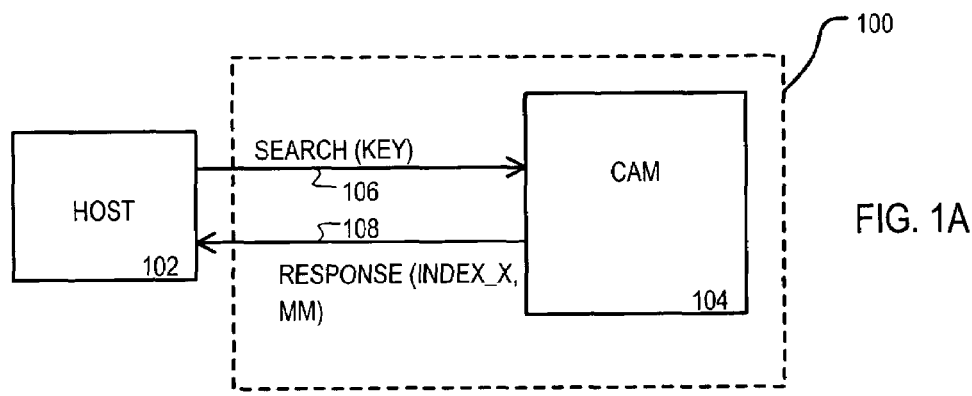
FIGS. 1A–1C are block diagrams of a search engine having a request and response operation according to one embodiment of the present invention.
Figure 1B:
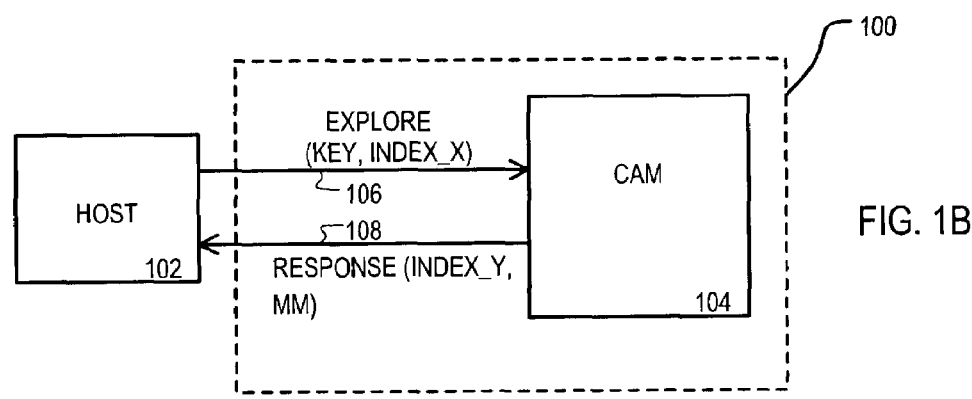
Figure 1C:
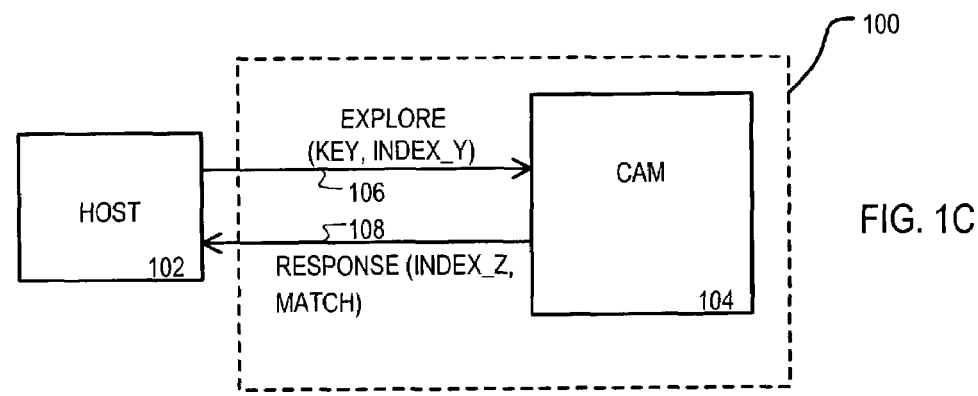

FIGS. 1A to 1C show a search engine system and operation according to one embodiment. A search engine system is designated by the general reference character 100 and is shown to be connected to a request issuing device 102. A request issuing device 102 may issue search and other requests to a search engine system 100. A search engine system 100 may include at least one content addressable memory (CAM) device 104.

Like a conventional CAM device, a CAM device 104 of search engine system 100 may be capable of executing a search operation in response to the application of at least a search key value. For example, in response to a search key value, a CAM device 104 may compare such a key value to data values in CAM entries to generate a compare result. Such a compare result may include an index value, corresponding to a highest priority match indication (assuming an entry matches the search key). In addition, such a result may include a result value. Examples of typical search results are: a single match between the search key and a CAM entry, a multiple match between the search key and multiple CAM entries, and/or a "miss" indicating that no CAM entries match an applied search key.

Comparison of a search key to CAM entry values can also be referred to as a CAM "match" function, as such a function detects matches between a search key and CAM entry data values.

It is understood that according to the present invention, a CAM compare operation between a search key and CAM entries may include a binary CAM comparison and/or a ternary CAM comparison (e.g., utilization of mask bits and/or patterns to exclude selected bits from such a compare). Still further, in some arrangements such a comparison may be between a search key and valid CAM entries, where the validity of a CAM entry may be indicated by one or more valid bits, or the like.

Unlike a conventional CAM device, a CAM device 104 of search engine system 100 may include a restricted search mode in which the CAM device 104 can execute a "restricted" search operation. A restricted search operation may compare only a subset (e.g., a portion) of the CAM entries to a search key device. Looked at in another way, entries of a CAM device may be considered a memory segment, and a restricted search operation may search less than all of the CAM entries in such a memory segment.

Preferably, a restricted search operation may restrict searches to entries having an index value greater than a received search index value. A restricted search operation may also be referred to as an "explore" operation herein. The inclusion of "explore" capabilities can enable the extraction of multiple match results. Such a feature will now be described with reference to FIGS. 1A to 1C.

FIG. 1A shows one example of a search operation according to an embodiment. Such a search operation can include a requesting device 102 issuing a search request SEARCH (e.g., a command). Such a search request SEARCH may include a search key value KEY. While a search request may take various forms, such as predetermined control and data signals on dedicated signal lines, a search request may preferably be in a "packet" format transmitted on one or more point-to-point input connections 106.

A CAM device 104 may generate a response from a received search request. In the particular example of FIG. 1A, a CAM device 104 returns a response RESPONSE that provides an index value INDEX_X for a matching CAM entry. Further, if a search request has resulted in a multiple match indication, "MM" indicates that there is at least one more CAM entry, of lower priority, that matches an applied search key value KEY. While a CAM response may take various forms, such as predetermined control and data signals on dedicated signal lines, a CAM response may preferably be in a "packet" format transmitted on one or more point-to-point output connections 108.

Thus, FIG. 1A shows an "unrestricted" search of CAM entries (e.g., a memory segment) in which all valid entries are compared to a search key KEY.

FIG. 1B shows an example of a restricted search (e.g., an explore operation) according to an embodiment. Such an explore operation can include a requesting device 102 issuing an explore request EXPLORE (e.g., a command). Such an explore request EXPLORE may include a search key value KEY as well as a search index value INDEX_X from a previous higher priority CAM entry.

In response to an explore request, a CAM device 104 may restrict a search operation (e.g., a matching function) to a sub-set of the CAM entries. Preferably, such a function may compare a search key KEY to only those CAM entries having index values greater than a search index value. Thus, in FIG. 1B, a CAM device 104 may search CAM entries having corresponding index values that are greater than INDEX_X. Consequently, a CAM device 104 can return a response RESPONSE that provides an index value INDEX_Y for a matching CAM entry having a highest priority among CAM entries with an index value of greater than INDEX_X. Such an index value is shown as INDEX_Y. Like the previous search request of FIG. 1A, the explore request of FIG. 1B also results in a multiple match indication "MM" indicating that there remains at least one more CAM entry, of lower priority, that matches an applied search key value KEY.

Thus, FIG. 1B shows a "restricted" search of the CAM entries (e.g., a memory segment) in which only a portion (e.g., a subset) of the CAM entries are compared to a search key KEY.

In this way, a lower priority matching entry may be extracted from a CAM device when a multiple match condition exists. Such an approach may be accomplished by exploring those entries beyond (e.g., those entries having a lower priority) a matching entry. Such an operation may be repeated until a last matching entry of the multiple matching case is extracted. An example of a last search is shown in FIG. 1C.

FIG. 1C shows a second example of an explore operation according to an embodiment. In FIG. 1C, a requesting device 102 issues an explore request EXPLORE that includes a search key value KEY as well as a search index value INDEX_Y from a previous higher priority CAM entry.

In response to the explore request of FIG. 1C, a CAM device 104 may compare a search key KEY to only those CAM entries having index values greater INDEX_Y. Consequently, a CAM device 104 can return a response RESPONSE that provides an index value INDEX_Z for a matching CAM entry having a highest priority among CAM entries with an index value of greater than INDEX_Y. Unlike FIG. 1A or 1B, the explore request of FIG. 1C also results in a single match indication "MATCH." This can indicate that index value INDEX_Z corresponds to a lowest (e.g., last) matching entry from a multiple match result.

Thus, FIG. 1C shows another restricted search of the CAM entries (e.g., a memory segment) in which only a portion (e.g., a subset) of the CAM entries compared to a search key KEY. The portion of CAM entries searched in FIG. 1C is less than that of FIG. 1B. In this way a sequence of explore operations can search consecutively smaller spaces to extract match indications and indices for a multiple match case.

It is noted that the embodiment shown in FIGS. 1A to 1C does not include multiple write operations, as in the above described conventional case. That is, in a conventional approach to extracting multiple match results, match bits may be set in all matching entries along with a key match bit.

Further, the embodiment of FIGS. 1A to 1C may provide more flexibility than conventional approaches, as identifying matching entries does not necessarily rely on maintaining multiple match states in particular entries. In particular, in the conventional approach described above, match bit states are maintained to extract multiple match results. Such states may have to be maintained, thus preventing other searches from taking place, or may have to be re-established in the event a search operation is executed before all matching entries are extracted. This is in contrast to the approach shown in FIGS. 1A to 1C, which can yield multiple match results with an explore command that includes a search key value and an index value. It is understood that other searches with different key values may have taken place between the operations shown in FIGS. 1A and 1B and/or between operations shown in FIGS. 1B and 1C.

Figure 2A:
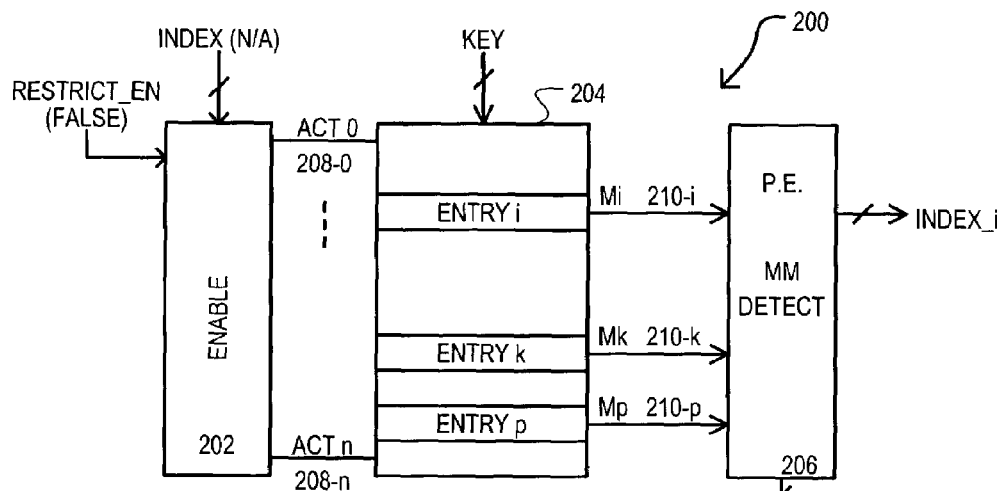
FIGS. 2A–2C are block diagrams showing the operation of a content addressable memory (CAM) device according to one embodiment of the present invention.
Figure 2B:
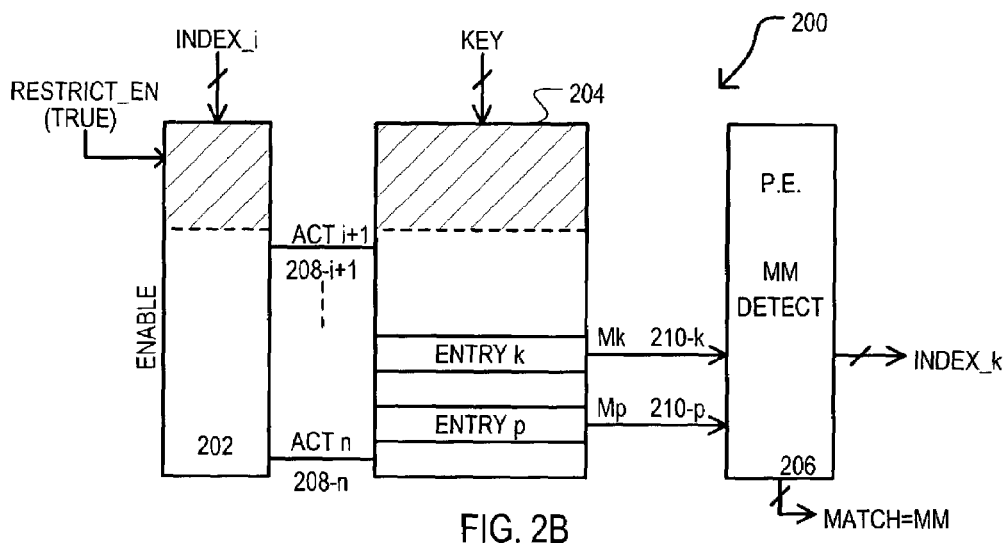
Figure 2C:
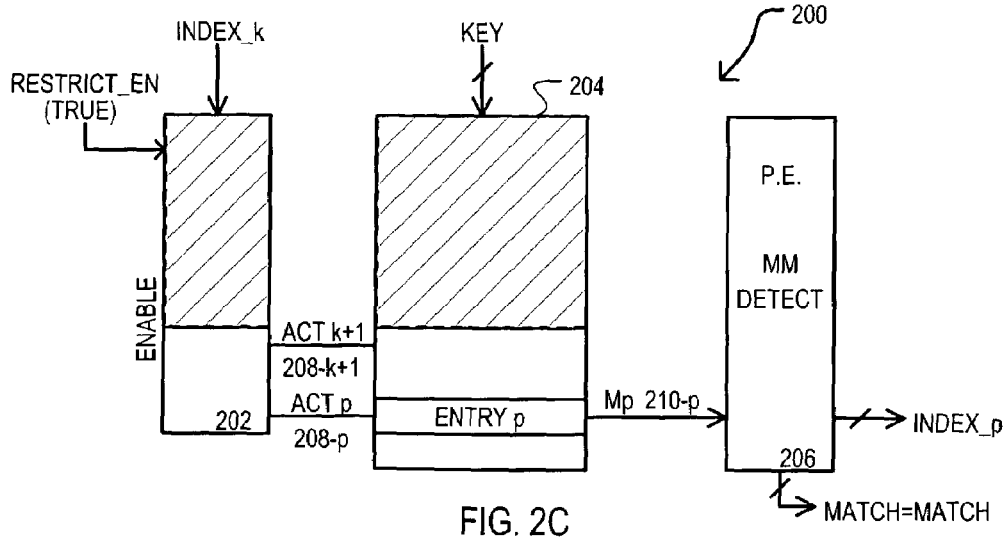

Referring now to FIGS. 2A to 2C, a CAM device according to one embodiment is set forth in a block diagram and designated by the general reference character 200. A CAM device 200 may include an enable circuit 202, CAM entries 204, and a priority encoder/multiple match detect (P.E./MM) circuit 206.

CAM entries 204 may each store a data value for comparison with an applied search key value KEY. Each of the CAM entries 204 can provide a match indication to a P.E./MM circuit 206. A P.E./MM circuit 206 may prioritize from among multiple active match indications to arrive at a highest priority active match indication. Such a highest priority active match indication may be encoded into an index value.

Unlike a conventional CAM device, a CAM device 200 may include an enable circuit 202. An enable circuit 202 may selectively enable only portions of CAM device 200 to thereby allow search results to be generated from a restricted search space. In the particular example of FIGS. 2A to 2C, an enable circuit may provide activation signals to each CAM entry. Thus, if an activation signal is active, a CAM entry may be enabled. However, if an activation signal is not active, a CAM entry can be disabled. An enabled CAM entry can generate an active match indication when its stored data value matches an applied comparand. A disabled CAM entry can be prevented from generating an active match indication even when its stored data value matches an applied comparand.

Alternatively, disabling a CAM entry can include "ignoring" a match indication from such an entry. Ignoring a match indication can include preventing such an indication from generating a valid match indication with logic circuits, or the like.

Further, in the particular arrangement of FIGS. 2A to 2C, an enable circuit 202 may receive a search index value as well as a restricted search enable signal RESTRIC_EN. If a restricted search enable signal RESTRIC_EN has one value (false), all activation signals can be active. This can enable all CAM entries 204, thus allowing a search key to be applied to all CAM entries 204. In this way, a CAM device may execute an "unrestricted" search. In contrast, if a restricted search enable signal RESTRIC_EN has another value (true), selected activation signals may be inactive, thus restricting the application of a search key to a limited number of CAM entries 204. In this way, CAM device may execute a "restricted" search. Preferably, an enable circuit 202 may execute restricted searches according to a search index value.

Examples of unrestricted and restricted searches will now be described with reference to FIGS. 2A to 2C.

FIG. 2A shows one example of an unrestricted search operation that results in a multiple match state. In FIG. 2A, a restricted search enable signal RESTRIC_EN is false, thus an enable circuit 202 may activate all activation signals ACT 0 to ACT n. Activation signals (ACT 0 to ACT n) may be provided to corresponding CAM entries 204 on activation lines 208-0 to 208-n. In FIGS. 2A to 2C only activation lines carrying active activation signals are shown. Thus, FIG. 2A shows activation lines 208-0 to 208-n, corresponding to all active activation signals ACT 0 to ACT n, respectively. In this way, in an unrestricted search, all valid CAM entries 204 may be enabled. As a result, data within CAM entries 204 may be compared to a search key value KEY.

In the example of FIG. 2A, a search key KEY matches three entries ENTRY i, ENTRY k, and ENTRY p. Matching entries (ENTRIES i, k, p) activate corresponding match indications M1, Mk, and Mp. Match indications may be provided to a P.E./MM circuit 206 on corresponding match lines. In FIGS. 2A to 2C only match lines carrying active match indications are shown. Thus, FIG. 2B shows match lines 210-k and 210-p, corresponding to active match indications Mk, and Mp, respectively.

In the particular arrangement of FIGS. 2A to 2C, it is assumed that CAM entries 204 have a physical priority with respect to one another. More particularly, a CAM entry with a lower corresponding index value may have higher priority. Still further, in FIGS. 2A to 2C it will be assumed that priority between entries is sequential with a top most entry (receiving activation signal ACT 0) having a highest priority and a bottom most entry (receiving activation signal ACT n) having a lowest priority. Thus, a physical priority among matching entries in FIG. 2A, going from highest priority to lowest priority may be: ENTRY i, ENTRY k, and ENTRY p.

Referring still to FIG. 2A, active match indications Mi, Mk and Mp may be received by P.E./MM circuit 206. P.E./MM circuit 206 may select match indication Mi as a highest priority match indication, and may encode such a match indication into an index value INDEX_i. In addition, P.E./MM circuit 206 may generate a multiple match indication MM, as more than one active match indication is received.

Thus, if CAM entries 204 are considered a memory segment, an unrestricted search may search the segment without restriction.

FIG. 2B shows one example of a restricted search operation, based on the results of the unrestricted search operation of FIG. 2A. The restricted search operation shown in FIG. 2B can extract a next highest priority matching entry result. In FIG. 2B, a restricted search enable signal RESTRIC_EN is true, thus an enable circuit 202 may activate only a portion of activation signals ACT 0 to ACT n based on a received search index value. In FIG. 2B, a received search index value may be INDEX_i. Consequently, enable signal 202 may activate signals ACT i+1 to ACT n, but deactivate signals ACT 0 to ACT i.

Activated activation signals (ACT i+1 to ACT n) may be provided to corresponding CAM entries 204 to enable only those entries. As a result, data within CAM entries 204 corresponding to index values INDEX_k+1 to INDEX_n can be compared with a search key value KEY.

In the example of FIG. 2B, a search key KEY (the same search key of FIG. 2A) matches two entries ENTRY k and ENTRY p. ENTRY i may be excluded from a match operation as a corresponding activation signal ACT i may be inactive. Matching entries (ENTRIES k and p) activate corresponding match indications Mk and Mp.

Active match indications Mk and Mp may be received by a P.E./MM circuit 206. P.E./MM circuit 206 may select match indication Mk as a highest priority match indication and encode such a match indication into an index value INDEX_k. In addition, P.E./MM circuit 206 may generate a multiple match indication MM, as two active match indications are received.

Thus, if CAM entries 204 are considered a memory segment, a restricted search like that shown in FIG. 2B, may search a subset of the segment (e.g., from ENTRY i+1 to ENTRY n). More particularly, such a restricted search can divide a memory segment based on a received index value. That is, the reception of index value INDEX i can result in CAM entries 204 being divided into a non-searched subset (entries ENTRY 0 to ENTRY i) and a searches subset (entries ENTRY i+1 to ENTRY n).

FIG. 2C shows one example of a restricted search operation based on results of the restricted search operation of FIG. 2B. Such an operation can extract a last matching entry result. In FIG. 2C, a restricted search enable signal RESTRIC_EN is true, thus an enable circuit 202 may activate only a portion of activation signals ACT 0 to ACT n based on a received search index value. In FIG. 2C, a received search index value may be INDEX_k. Consequently, enable signal 202 may activate signals ACT k+1 to ACT n, but deactivate signals ACT 0 to ACT k.

Activated activation signals (ACT k+1 to ACT n) may be provided to corresponding CAM entries 204 to enable only those entries. As a result, data within CAM entries 204 corresponding to index values INDEX i+1 to INDEX_n can be compared with a search key value KEY.

In the example of FIG. 2C, a search key KEY (the same search key of FIGS. 2A and 2B) now matches only ENTRY p. ENTRY i and ENTRY k may be excluded from a match operation as a corresponding activation signals ACT i and ACT k may be inactive. Matching entry ENTRY p can activate corresponding match indication Mp.

Active match indication Mp may be received by a P.E./MM circuit 206. P.E./MM circuit 206 may encode such a match indication into an index value INDEX_p. In addition, P.E./MM circuit 206 may generate a single match indication MATCH, as only one active match indication is received in FIG. 2C.

Figure 3A:
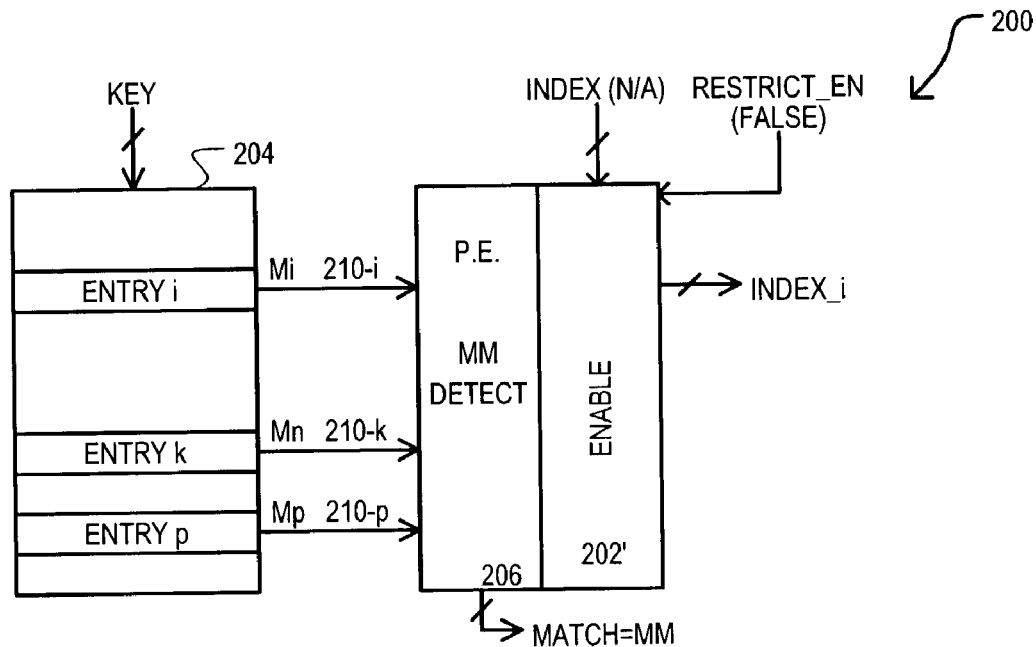
FIGS. 3A and 3B are block diagrams showing the operation of a CAM device according to another embodiment of the present invention.
Figure 3B:
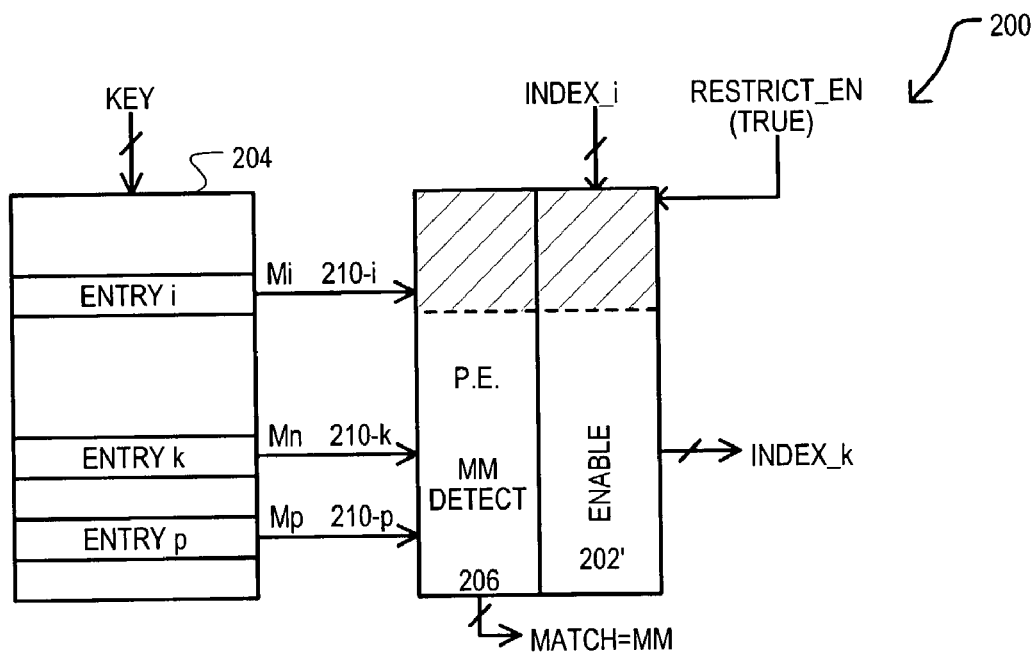

Referring now to FIGS. 3A and 3B, an alternate embodiment for enabling unrestricted and restricted search operations are shown in a block diagram. In the approach of FIG. 3A, an enable circuit 202' may be connected to a P.E./MM circuit 206.

FIG. 3A shows an unrestricted search operation. In FIG. 3A, a restricted search enable signal RESTRIC_EN is false, thus an enable circuit 202' may enable all entries of a priority encoder 206.

FIG. 3B shows a restricted search operation. In FIG. 3B, a restricted search enable signal RESTRIC_EN is true, thus an enable circuit 202' may disable entries of a priority encoder 206 according to an index value INDEX_i.

Unlike the approach of FIGS. 2A to 2C, in FIGS. 3A and 3B an enable circuit 202' may disable entries of a P.E./MM circuit 206, to thereby prevent the generation of index values greater than a search index value. Thus, while FIG. 3B shows an active match indication Mi, such an indication may be prevented from being encoded into an index value as a corresponding priority encoder entry 206 may be disabled.

Figure 4:
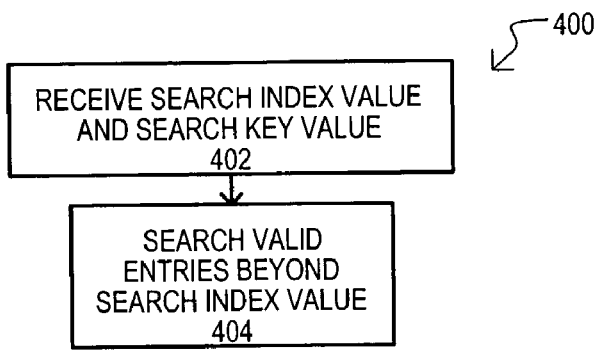
FIG. 4 is a flow diagram of restricted search method according one embodiment.

Referring now to FIG. 4, a restricted search method according to an embodiment is set forth in a flow diagram and designated by the general reference character 400. A method 400 may include receiving a search index value and a search key value (step 402). A step 402 may include a CAM device receiving a search key value and a search index value from a requesting device, such as a processor or the like, or another CAM device in cascaded systems that may include multiple CAM devices.

A search index value can correspond to an entry in the CAM device. More particularly, each CAM entry may correspond to a particular index value, and a search index value can correspond to one of the index values. Even more particularly, each CAM entry may have an address, and an index value may be equal to or encode to such addresses.

A method 400 may also include searching valid entries beyond the index value (step 404). A step 404 may include searching only valid entries having a priority less than that indicated by a search index value. As but one example, a step 404 can include searching those valid CAM entries having an index value greater than a search index value.

Thus a step 404 may search only a portion (e.g., subset) of the CAM entries according to a value that identifies a particular CAM entry (in this case the search index value).

Figure 5:
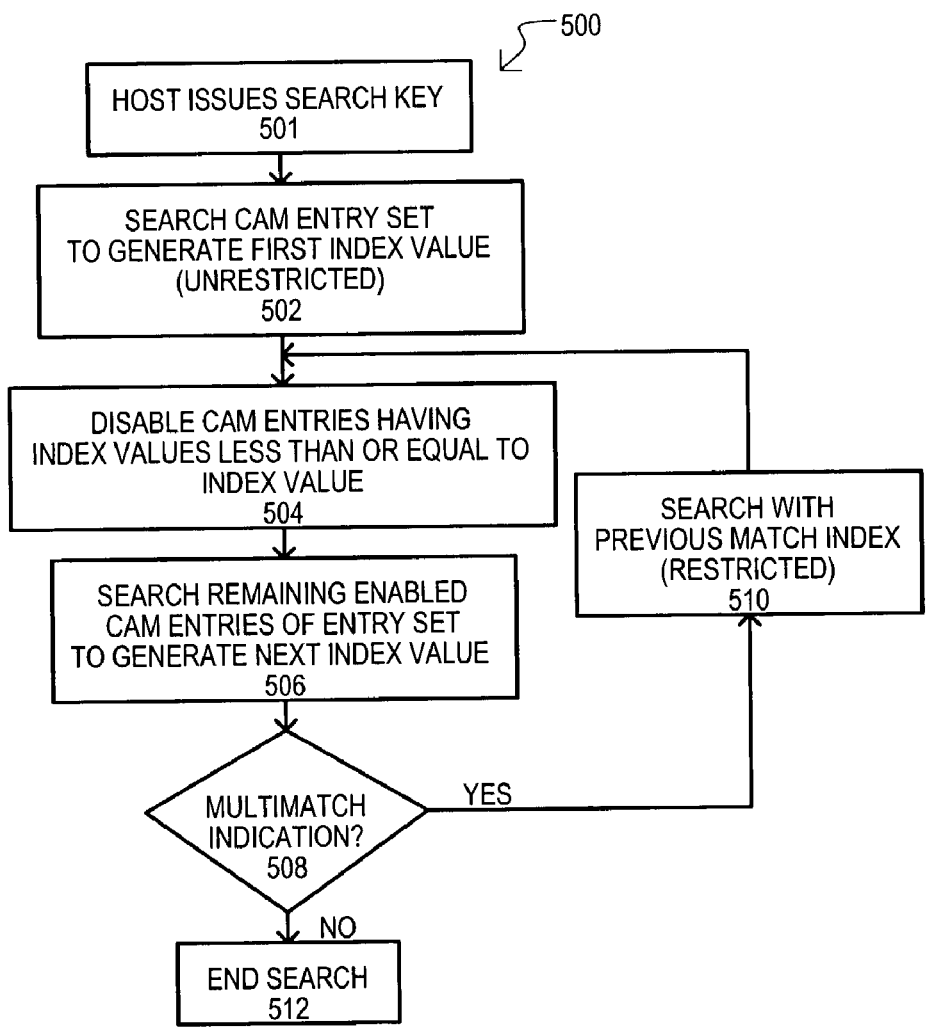
FIG. 5 is a flow diagram of a method of extracting multiple match results according to an embodiment.

Referring now to FIG. 5, a method of extracting multiple match results is shown in a flow diagram and designated by the general reference character 500. A method 500 may include a request issuing device, such as a host, issuing a search key (step 501). A method may then search a CAM entry set to generate a first index value (step 502). A CAM entry set may be a predetermined collection of CAM entries (e.g., a memory segment). Each CAM entry may also have a corresponding index value. A first index value may be generated from a highest priority CAM entry that stores data matching a search key. Because a step 502 may include searching all valid CAM entries of a CAM entry set, such a step may be considered an "unrestricted" search.

A method 500 can further include disabling entries having index values less than or equal to an index value (step 504). Thus, a method 500 can reduce a search space (e.g., number of entries) according to a previous search result (e.g., a first index value initially). In this way, CAM entries may be divided according to an index value.

A method 500 can then include searching remaining enabled CAM entries of the entry set to generate a second index value (step 506). A second index value may be the next higher priority CAM entry that stores data matching a search key.

In this way, a first operation (e.g., step 502) may extract a first matching entry from among multiple matching entries. A second operation (e.g., step 506) may extract a second matching entry from any remaining matching entries. This may be accomplished by searching a portion (e.g., a subset) of the CAM entries.

A method 500 may have additional steps, including checking for a multimatch indication 508. Such a step can determine if more than one CAM entry matches an index value.

If a multimatch indication is active (YES), a search may be undertaken with a previous match index (step 510). Such a step may include searching with a next higher priority index value. Because such a step may include searching only a portion of a CAM entry set, such a step may be considered a "restricted" search.

If a multimatch indication is inactive (NO), a search may be ended, indicating that a last matching entry of a CAM entry set has been extracted.

The above embodiments have described arrangements in which a restricted search may be undertaken to a subset of CAM entries in a group of CAM entries.

Figure 6:
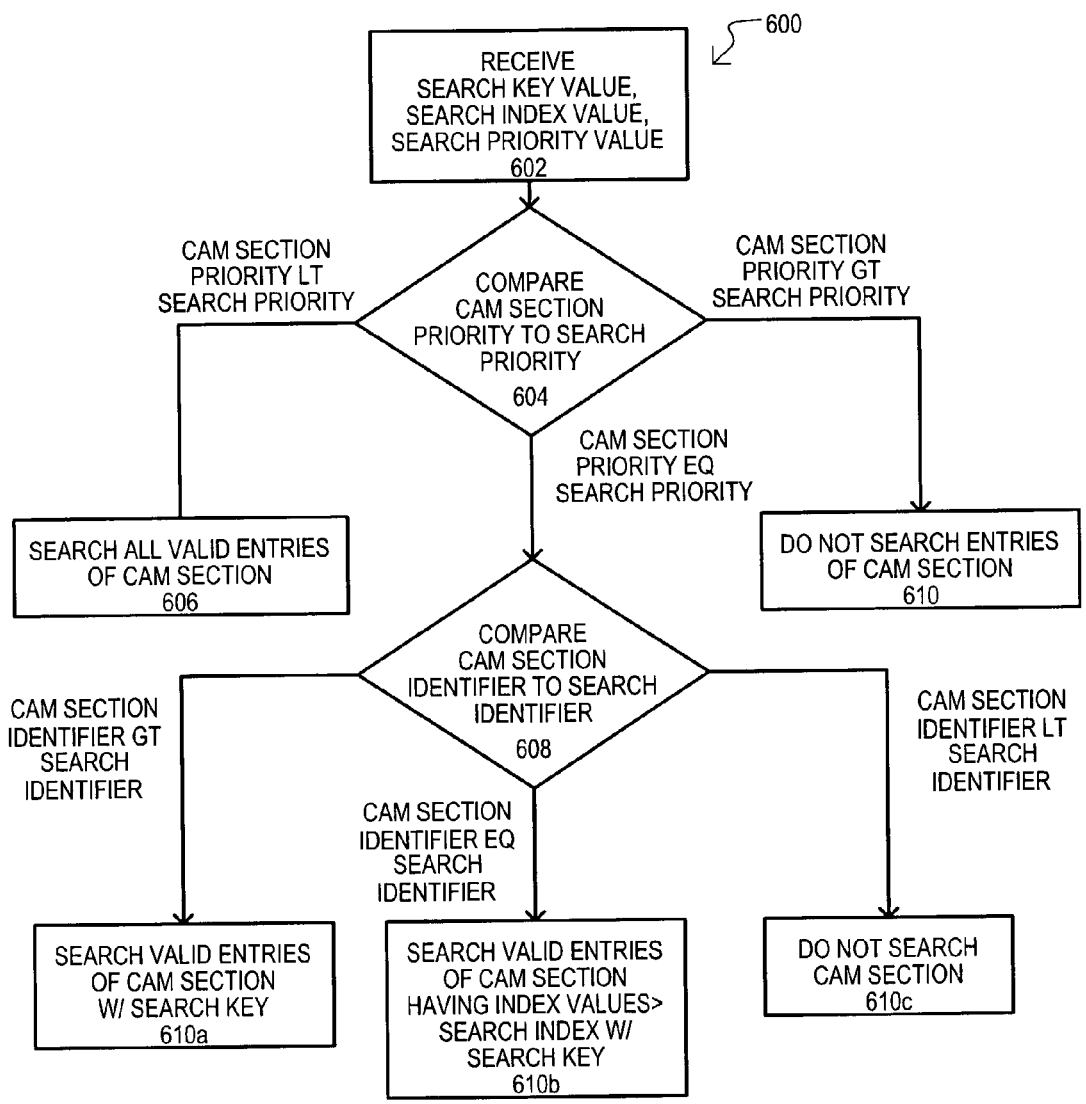
FIG. 6 is a flow diagram of a restricted search method according to another embodiment.

However, the present invention may also include restricted searches in selected portions of a CAM device, while other portions are not searched and/or searched in an unrestricted fashion. FIG. 6 shows such a method.

FIG. 6 is a CAM device search method that may include a number of different sections (e.g., portions or memory segments). Each section can include multiple CAM entries. Unlike conventional CAM arrangements, a different priority value may be set for each section. In one particular arrangement, each section may include a same number of CAM entries. Further, each section may have a same set of index values, and/or in addition may have a unique section identifier, corresponding to the CAM entries. Thus, each CAM section may have a built-in physical priority among its own entries but also provide a programmable or "soft" priority associated with all of its entries.

It is understood that a CAM "section" can correspond to a group of CAM entries, or a "sub-block" of CAM entries, or a "block" of CAM entries.

Referring now to FIG. 6, a method is designated by the general reference character 600 and may include receiving a search key value, a search index value and a search priority value (step 602). A search key value may be compared to CAM entries in a search operation. A search index value may be used to separate entries of a CAM section into at least two portions, where one portion is searched while another is not. That is, a search index value may divide a memory segment into at least two subsets.

It is noted that a search index may include a section identifier and an "offset" value. A section identifier may identify a particular CAM section, and an offset value may correspond to a particular CAM entry within the section. Thus, in one very particular arrangement, a search index value may equal a section identifier plus an offset value.

A search priority value may be a priority associated with a search operation, and may have a value with respect to soft priorities of various CAM sections. That is, a search priority value may be considered to have a greater (higher) priority, equal priority or lower priority to a CAM section priority.

A step 602 may include a CAM device receiving predetermined control and data values. Preferably, such values may be received in the form of a packet. Even more preferably, such request packet data may be received via a point-to-point connection either directly from a requesting device, or via another device in the system that forwards such a data packet. Of course, alternatively, a step 602 may include a CAM device receiving control and data signals via predetermined signal lines.

As shown in FIG. 6, a method 600 may include comparing a CAM section priority to a search priority (step 604). A step 604 may include comparing a magnitude of a CAM section soft priority value with that of a search priority value. Such a comparison may yield three results: less than LT, equal to EQ, or greater GT. Of course, such a comparison may determine higher priority according to lower priority value, or vice versa.

If a CAM section priority is less than that of a search priority, all valid entries of a CAM section may be searched (step 606). That is, a CAM section may be subject to an unrestricted search.

However if a CAM section priority is greater than that of a search priority, a CAM section may not be searched (step 610).

Still further, if a CAM section priority is equal to that of a search priority, searching may or may not proceed based on additional criteria. Such additional criteria can include a CAM section identifier. As noted above, such a CAM section identifier may be part of a search index. Thus, FIG. 6 also includes comparing a search identifier to section identifiers (step 608).

If a CAM section identifier is greater than a search identifier, all valid entries within such a CAM section may be searched (step 610a).

If a CAM section identifier is equal to a search identifier, all valid entries having index values greater than a search index can be searched (step 610b). That is, a CAM section may be subject to restricted search as described above.

If a CAM section identifier is less than a search identifier, a CAM section may be excluded from a search (step 610c).

In this way, a priority value associated with a CAM section may be examined to determine if a CAM section is subject to an unrestricted search, restricted search, or not searched at all.

While the present invention shows devices and methods for executing restricted or unrestricted searches on portions of a CAM device according to priority values, it may be desirable to select given portions of a CAM device based on other or additional features. One such embodiment will now be described with reference to FIGS. 7A–7E and 8A and 8B.

FIGS. 7A–7E show a CAM device 700 that may include four portions (e.g., memory segments) 702-0 to 702-3 that will be referred to herein as "sub-blocks." It is understood that each sub-block may include a number of CAM entries, preferably a same number of CAM entries. Further, each sub-block may have a corresponding set of index values INDEX 00 to INDEX FF. In the various examples of FIGS. 7A–7E, sub-blocks 702-0 to 702-3 can each represent a given search space resulting from a particular request. Portions (e.g., subsets) of a sub-blocks excluded from a search operation are represented by hatching.

FIGS. 7A–7E also show features 704-0 to 704-3 associated with each sub-block. In the example of FIGS. 7A–7E, sub-block features (704-0 to 704-3) include a sub-block number SB# and a sub-block priority value SBP. A sub-block feature (704-0 to 704-3) (SB# or SBP) may be "hard" value, and thus set within a CAM device 700 during manufacturing. Alternatively, a sub-block feature (704-0 to 704-3) (SB# or SBP) may be "soft" (e.g., programmable), and thus can be set after a device is produced. Preferably, a sub-block number SB# may be a hard value while a sub-block priority value SBP may be a soft value.

In one very particular arrangement, a sub-block block number SB# may be higher order address bits of CAM entries, while an index value INDEX 00 to INDEX FF may be lower order address bits for entries.

FIGS. 7A–7E each show a particular command requests 706-0 to 706-4. Command requests 706-0 to 706-2 show examples of an explore "less-than-or-equal-to" request EXPLORE LE. Command requests 706-3 and 706-4 show examples of an explore "equal-to" request EXPLORE_EQ. Such particular commands will now be described with reference to FIGS. 8A and 8B.

FIG. 8A shows a table illustrating the operation of an explore less-than-or-equal-to request EXPLORE LE. FIG. 8B shows a table illustrating the operation of an explore equal-to request EXPLORE EQ.

In both FIGS. 8A and 8B, a column "No." shows a result of a comparison between a sub-block number SB# and a search sub-block number SEARCH SB#: less than (LT), equal to (EQ), or greater than (GT). A column OFFSET shows how a search may be restricted. A term "GT" indicates that search is restricted by offsetting a search space according to a search index value SEARCH INDEX. A column SOFT PRIORITY shows a result of a comparison between a sub-block priority value SBP and a search sub-block priority SEARCH SBP: less than (LT), equal to (EQ), or greater than (GT). A "# MATCH" column shows a search result from applying a search key value SEARCH KEY to a sub-block. A term MATCH2 indicates a multiple match case. A term MATCH1 indicates a single match case. A term NO MATCH DATA indicates no match results.

Referring now to FIGS. 7A to 7C, three examples of an explore less-than-or-equal-to operation EXPLORE_LE will now be described.

Referring now to FIG. 7A, a CAM device 700 may receive an explore less-than-or-equal-to EXPLORE LE request 706-0 that includes a search sub-block priority SEARCH SBP of "8", a search sub-block number SEARCH SB# of "1", a search index value SEARCH INDEX of "0F", and a search key value of "KEY".

In response to a request 706-0, a CAM device 700 may compare sub-block features to corresponding search parameters. According to such a comparison, a CAM device 700 can execute an unrestricted search, restricted search, or inhibit a search in a sub-block.

In the very particular case of FIGS. 7A to 7C, a CAM device 700 may function according to FIG. 8A for sub-block priority values that are less than or equal to a search priority value. Further, it is assumed that a lower magnitude priority value corresponds to a higher priority.

Accordingly, in FIG. 7A, sub-block 702-0 has sub-block priority SBP of 6. This is greater (a higher priority) than the search sub-block priority of request 706-0. Consequently, sub-block 702-0 falls outside the rules indicated in FIG. 8A, and can be excluded from a search operation.

In contrast, sub-block 702-1 has sub-block priority SBP of 8. This is equal to the search sub-block priority value of request 706-0. Consequently, sub-block 702-1 falls within the rules indicated in FIG. 8A. Sub-block 702-1 also has sub-block number value SB# of 1. This is also equal to the search sub-block number of request 706-0. As shown in FIG. 8A, an equal sub-block priority and sub-block number can result in a restricted search. Thus, sub-block 702-1 can be subject to a restricted search that divides entries in sub-block 702-1 according to search index value SEARCH INDEX OF provided with request 706-0.

FIG. 7A also shows that sub-blocks 702-2 and 702-3 have sub-block priorities SBP of 10 and 11, respectively. These sub-block priority values are less than the search sub-block priority value of request 706-0. Consequently, sub-blocks 702-2 and 702-3 fall within the rules indicated in FIG. 8A. Sub-block 702-1 also has a sub-block number value SB# of 8. This is also equal to the search sub-block priority value of request 706-0. As shown in FIG. 8A, a lower sub-block priority and greater sub-block number can result in an unrestricted search. Thus, sub-blocks 702-2 and 702-3 can be subject to an unrestricted search in response to the particular request 706-0 of FIG. 7A.

In FIG. 7B a CAM device 700 may receive an explore less-than-or-equal-to request EXPLORE LE 706-1 having the same parameters as that shown as 706-0 in FIG. 7A. However, due to different sub-block priority values, a different operation can result.

In FIG. 7B, sub-block 702-0 has sub-block priority SBP of 11. This is lower than the search sub-block priority of request 706-1. Consequently, sub-block 702-0 falls within the rules indicated in FIG. 8A. Sub-block 702-0 also has sub-block number value SB# of 0. This is less than the search sub-block priority number of request 706-1. As shown in FIG. 8A, a lower sub-block priority and lower sub-block number can result in an unrestricted search. Thus, sub-block 702-0 can be subject to an unrestricted search in response to request 706-1.

In FIG. 7B, sub-block 702-1 has the same parameters as in FIG. 7A and thus generates a same result: a search restricted according to a search index value provided in request 706-1.

In FIG. 7B, sub-block 702-2 has the same parameters as in FIG. 7A and thus generates a same result: an unrestricted search.

In FIG. 7B, sub-block 702-3 has sub-block priority value SBP of 7. Such a sub-block 10 priority value has a higher priority than the search sub-block priority of request 706-1. Consequently, sub-block 702-3 falls outside the rules indicated in FIG. 8A, and can be excluded from a search operation.

In FIG. 7C, a CAM device 700 may receive an explore less-than-or-equal-to request EXPLORE LE 706-2 having the same parameters as that shown as 706-0 and 706-1 in FIGS. 7A and 7B, respectively.

In FIG. 7C, sub-block 702-0 has sub-block priority SBP of 8. This is equal to the search sub-block priority value of request 706-2. However, sub-block 702-0 has a sub-block number value SB# of 0, which is less than a search sub-block number of 1. Consequently, sub-block 702-0 falls outside the rules indicated in FIG. 8A, and can be excluded from a search operation.

Sub-block 702-1 has sub-block priority value SBP of 9. This is less (of lower priority) than the search sub-block priority value of request 706-2. Consequently, sub-block 702-1 falls within the rules indicated in FIG. 8A. As shown in FIG. 8A, a lower sub-block priority can result in an unrestricted search.

In FIG. 7C, sub-block 702-2 has sub-block priority value SBP of 8. This is equal to the search sub-block priority value of request 706-2. Consequently, sub-block 702-2 falls within the rules indicated in FIG. 8A. Sub-block 702-2 also has sub-block number value SB# of 2. This is greater than the search sub-block number value of request 706-2. As shown in FIG. 8A, an equal sub-block priority and greater sub-block number can result in an unrestricted search. Thus, sub-block 702-2 can be subject to an unrestricted search in response to request 706-2.

Similarly, in FIG. 7C, sub-block 702-3 has a lower sub-block priority and greater sub-block number than that of request 706-2. As shown in FIG. 8A, this can also result in an unrestricted search.

Figures 7D, 7E:
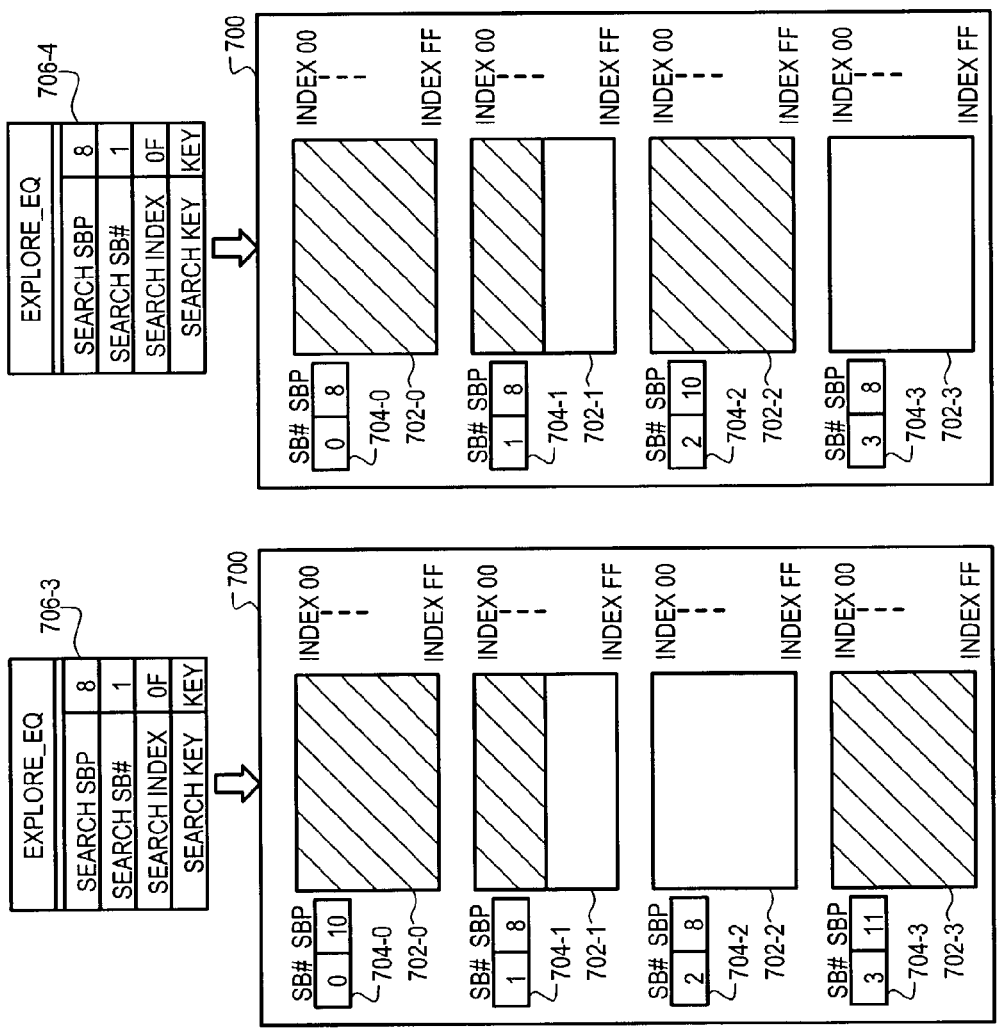

Referring now to FIGS. 7D and 7E, examples of an explore equal-to request EXPLORE EQ will now be described. In the very particular case of FIGS. 7D and 7E, a CAM device 700 may function according to FIG. 8B for sub-block priority values that are equal to a search priority value. Further, it is again assumed that a lower magnitude priority value corresponds to a higher priority.

Referring now to FIG. 7D, a CAM device 700 may receive an explore equal-to EXPLORE EQ request 706-3 that includes a search sub-block priority value SEARCH SBP of "8", a search sub-block number value SEARCH SB# of "1", a search index value SEARCH INDEX of "0F", and a search key value of "KEY".

In FIG. 7D, sub-block 702-0 has sub-block priority SBP of 10. This is not equal to the search sub-block priority value of request 706-0. Consequently, sub-block 702-0 falls outside the rules indicated in FIG. 8B, and can be excluded from a search operation.

In contrast, sub-block 702-1 has sub-block priority SBP of 8. This is equal to the search sub-block priority value of request 706-3. Consequently, sub-block 702-1 falls within the rules indicated in FIG. 8B. Sub-block 702-1 also has sub-block number value SB# of 1. This is also equal to the search sub-block number of request 706-3. As shown in FIG. 8B, an equal sub-block priority and sub-block number can result in a restricted search. Thus, sub-block 702-1 can be subject to a restricted search that divides entries in sub-block 702-1 according to search index value SEARCH INDEX OF provided with request 706-3.

In FIG. 7D, sub-block 702-2 has sub-block priority SBP of 8. This is also equal to the search sub-block priority value of request 706-3. Consequently, sub-block 702-2 falls within the rules indicated in FIG. 8B. Sub-block 702-2 also has sub-block number value SB# of 2. This is greater than the search sub-block number of request 706-3. As shown in FIG. 8B, an equal sub-block priority and greater sub-block number can result in an unrestricted search. Thus, sub-block 702-2 can be subject to an unrestricted search in response to request 706-3.

In FIG. 7D, sub-block 702-3 has sub-block priority SBP of 11. This is not equal to the search sub-block priority value of request 706-3. Consequently, sub-block 702-3 falls outside the rules indicated in FIG. 8B, and can be excluded from a search.

In FIG. 7E a CAM device 700 may receive an explore equal-to request EXPLORE EQ 706-4 having the same parameters as that shown as 706-3 in FIG. 7D. However, due to different sub-block priority values, a different operation can result.

In FIG. 7E, sub-block 702-0 has sub-block priority SBP of 8. This is equal to the search sub-block priority value of request 706-4. Consequently, sub-block 702-0 falls within the rules indicated in FIG. 8B. Sub-block 702-0 also has sub-block number value SB# of 0. This is less than the search sub-block number of request 706-4. As a result, sub-block 702-0 may be excluded from a search operation.

In FIG. 7E, sub-block 702-1 has the same parameters as in FIG. 7D and thus generates a same result: a search restricted according to a search index value provided in request 706-4.

In FIG. 7E, sub-block 702-2 has sub-block priority SBP of 10. This is not equal to the search sub-block priority value of request 706-4. Consequently, sub-block 702-2 falls outside the rules indicated in FIG. 8B, and can be excluded from a search.

In FIG. 7E, sub-block 702-3 has sub-block priority SBP of 8. This is equal to the search sub-block priority value of request 706-4. Consequently, sub-block 702-3 falls within the rules indicated in FIG. 8B. Sub-block 702-3 also has sub-block number value SB# of 3. This is greater than the search sub-block number of request 706-4. As a result, sub-block 702-3 may be subject to an unrestricted search.

It is understood that while FIGS. 7A–7E show the inclusion/exclusion of CAM entries at one particular organizational level (e.g., sub-block level), this concept can also be applied at other levels, such as a block level (where a block includes multiple sub-blocks) and/or a device level. In such arrangements a block number of device number could be included along with a sub-block address in a search index.

Referring now to FIG. 9A, one example of a request (e.g., command) format is shown in a block diagram. A request may be transmitted in packet form. That is, request data may be transmitted according to frames, or the like, with header information that can indicate data format within such a frame.

In the very particular example of FIG. 9A, a request may include a code field CODE that may store a code for indicating a start of a packet and/or a size of a packet. A target value TARGET can indicate a particular portion of one or more CAM devices, or TARGET can indicate a group of devices for which a request can be applied.

A command field CMD may indicate a type of operation. Thus, according to the present invention, a request may include a data field that indicates an "explore" operation that can specify a restricted search in a particular portion (e.g., sub-block) of CAM device. Preferably, a CMD field can include different predetermined bit combinations to indicate an explore less-than-or-equal-to request EXPLORE_LE and an explore equal-to request EXPLORE EQ. Of course, a command field CMD could also include a "search" command that can execute an unrestricted search for all portions (e.g., sub-blocks) of an CAM device.

Referring still to FIG. 9A, a request can also include a device field DEVICE that can indicate a CAM device and an INDEX field that can provide a search index value for use in an explore-type operation. A data field may include additional data that may be included in an explore function, such as a search priority value, search sub-block number, and/or search key or index to a search key.

Referring now to FIG. 9B, one example of response format is shown in a block diagram. A response may be generated from a CAM device in response to an explore-type request and transmitted in packet form. In the very particular example of FIG. 9B, a response may include a code field CODE that can be essentially the same as that of FIG. 9A. A target value TARGET can indicate a particular packet is a response packet and not a request packet. A status field STATUS can indicate an overall result from an explore-type request. In the very particular example of FIG. 9B, a status field STATUS can indicate a single match result MATCH1, a multiple match result MATCH2 or a no match result NO MATCH DATA.

In FIG. 9B, a priority field PRIORITY and an index field INDEX may be essentially the same as that of FIG. 9A. A device field DEVICE may indicate a device that has a highest priority matching index. In the case where there are no matches, the last device may be indicated in the device field DEVICE.

Figure 10A:
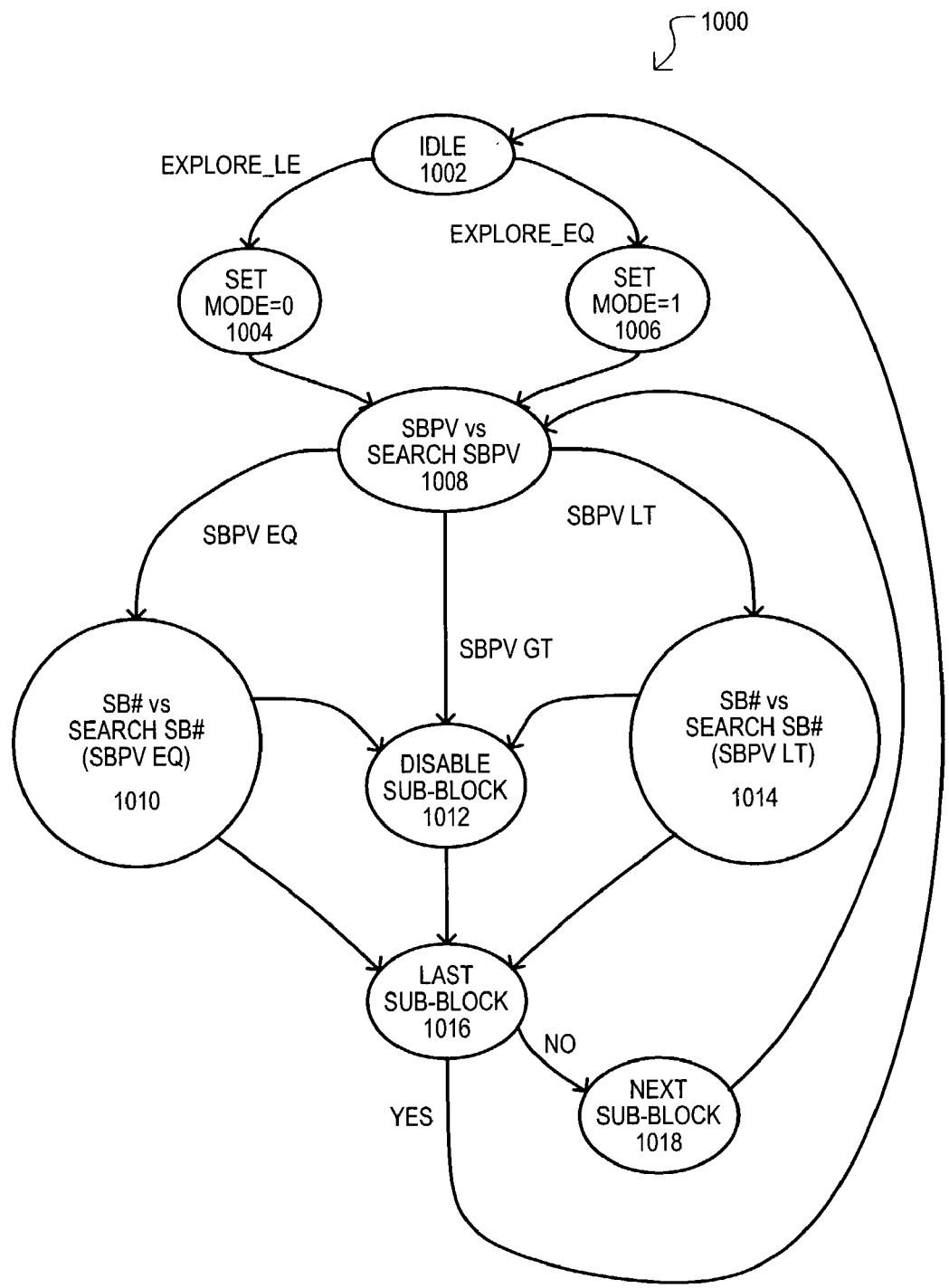
FIGS. 10A to 10C are state diagrams showing a CAM device/method according to an embodiment.
Figure 10B:
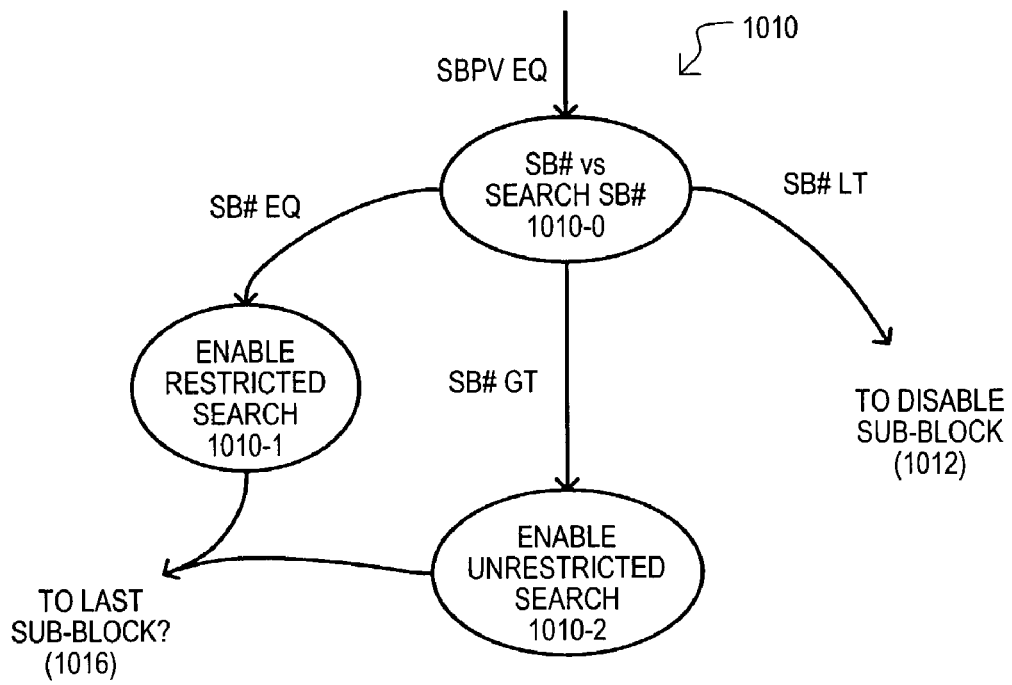
Figure 10C:
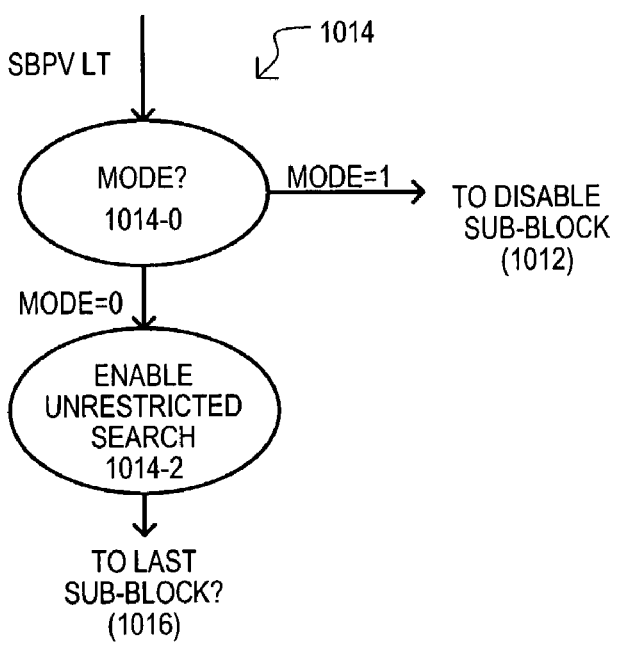

Referring now to FIGS. 10A to 10C, a CAM device/method state diagram is shown and designated by the general reference character 1000. Diagram 1000 can include an idle state 1002 in which a CAM device may await requests.

State diagram 1000 assumes that a CAM device has entries arranged into different sub-blocks, and each such sub-block has a priority value SBPV and a sub-block number value SB#. Such values may be as described with reference to FIGS. 7A to 7E.

As shown in FIG. 10A, a CAM device can set a particular mode value according to a received request. In particular, if an explore less-than-or-equal-to request EXPLORE_LE is received, a mode value MODE can be set to one value 1004 ("0" in this example). If an explore equal-to request EXPLORE_EQ is received, a mode value MODE can be set to another value 1006 ("1" in this example).

A CAM device can then compare a sub-block priority value SBPV to a search priority value SEARCH SBPV 1008. If a sub-block priority value SBPV is equal to a search priority value SBPV, a CAM device can transition through states shown as 1010. It is noted that states 1010 are shown in more detail in FIG. 10B. If a sub-block priority value SBPV is greater (higher priority) than a search priority value SBPV, a CAM device can disable a sub-block search 1012. If a sub-block priority value SBPV is less (lower priority) than a search priority value SBPV, a CAM device can transition through states shown as 1014. It is noted that states 1014 are shown in more detail in FIG. 10C.

Referring now to FIG. 10B, states 1010 of FIG. 10A are set forth in more detail. According to FIG. 10B, if a sub-block priority value SBPV is equal to a search priority value SEARCH SBPV, a sub-block number SB# may be compared to a search sub-block number SEARCH SB# 1010-0. If a sub-block number SB# is equal to a search sub-block number SEARCH SB# (SB# EQ), a restricted search function can be enabled within a sub-block 1010-1. If a sub-block number SB# is greater than a search sub-block number SEARCH SB# (SB# GT), an unrestricted search function can be enabled within a sub-block 1010-2. If a sub-block number SB# is less than a search sub-block number SEARCH SB# (SB# LT), a CAM device can disable a search in a sub-block (state 1012 in FIG. 10A).

Referring now to FIG. 10C, states 1014 of FIG. 10A are set forth in more detail. According to FIG. 10C, if a sub-block priority value SBPV is less than a search priority value, a mode value MODE may be checked 1014-0. If a mode value MODE is equal to zero (MODE=0), this can indicate an EXPLORE_LE operation, and an unrestricted search function can be enabled within a sub-block 1014-2.

However, if a mode value MODE has a second value (e.g., MODE=1), this can indicate an EXPLORE EQ operation. Consequently, a CAM device can disable a search in a sub-block (state 1012 in FIG. 10A).

Referring back to FIG. 10A, it is shown that restricted or unrestricted searches may be enabled or searches may be disabled in other sub-blocks in the same fashion. In the particular state diagram of FIG. 10A, a sub-block can be checked to see if it is a last sub-block 1016. If a last sub-block is reached, a CAM device may return to an idle state 1002. If a last sub-block is not reached, a CAM device may proceed to a next CAM block 1018.

States 1016 and 1018 are provided in FIG. 10A to illustrate determinations among multiple sub-blocks in a CAM. However, preferably, states 1002 to 1014 may be executed in parallel for numerous sub-blocks—rather than such determinations being made for sub-blocks in a sequential fashion. As such, states 1016 and 1018 may not be necessary.

Similarly, FIGS. 10A to 10C show but one very particular implementation, and variations would be obvious to those skilled in the arts. As but one example, a sub-block number comparison may occur in states executed prior to priority compare states.

Figure 11A:
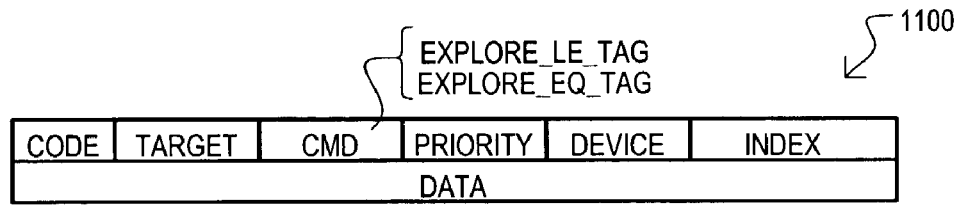
FIGS. 11A to 11C are block diagrams showing formats for a request and response that access tag data according to an embodiment.

Referring now to FIG. 11A, a second example of a request format is shown in a block diagram and designated by the general reference character 1100. A request may be transmitted in packet form. In the very particular example of FIG. 11A, a request may include the same essential fields as the request shown in FIG. 9A. However, a command field CMD within such a request may further include a "tag" type explore request. A tag type explore request may request a CAM device to generate a request for another storage device (e.g., a random access memory (RAM)), to thereby access associated data within such a different storage device.

Figure 11B:
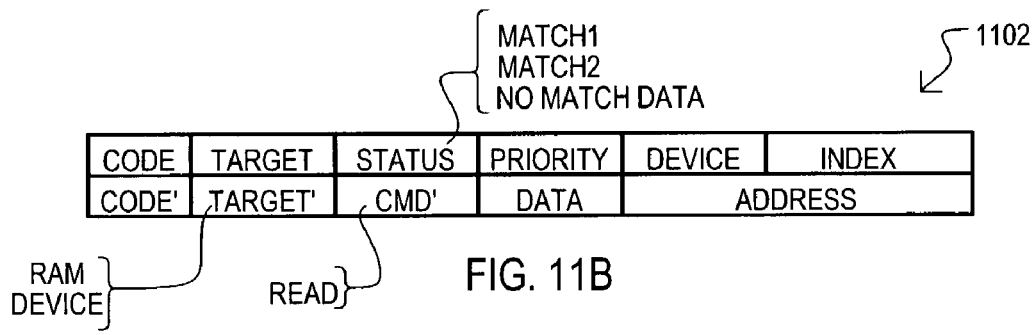

Referring now to FIG. 11B, a second example of response format is shown in a block diagram and designated by the general reference character 1102. According to the arrangement of FIG. 11B, a response may include the same essential fields as the request shown in FIG. 9B. However, a response may also include some additional fields for application to a storage device. Such additional fields may form a request for a storage device.

Thus, in the very particular example of FIG. 1I B, a response may include a request having the fields CODE', TARGET', CMD', DATA, and ADDRESS. A code field CODE' can be essentially the same as that in FIG. 9A. A target field TARGET', can be like that in FIG. 9A, but may indicate a particular portion of a storage device, instead of a CAM device. Similarly, a command field CMD', can include command, but such a command may be a storage device related command (such as a READ command, as but one example). A data field DATA may include additional information for use in a storage device operation. An address field ADDRESS may include all, or a portion of an address for a storage device location that is to be accessed.

Figure 11C:
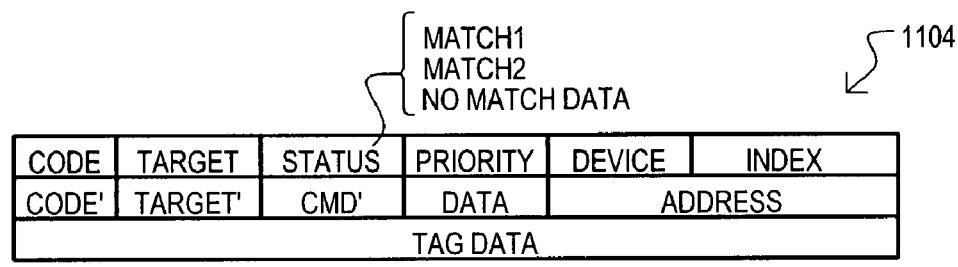

Referring now to FIG. 11C, an example of storage device response is shown in a block diagram and designated by the general reference character 1104. According to the arrangement of FIG. 11C, a storage device may include the same essential fields as the CAM device response shown in FIG. 11B. However, a storage device response may also include a tag data field TAG DATA, that includes associated data retrieved in response to an initial CAM request, like that shown in FIG. 11A.

Figure 12:
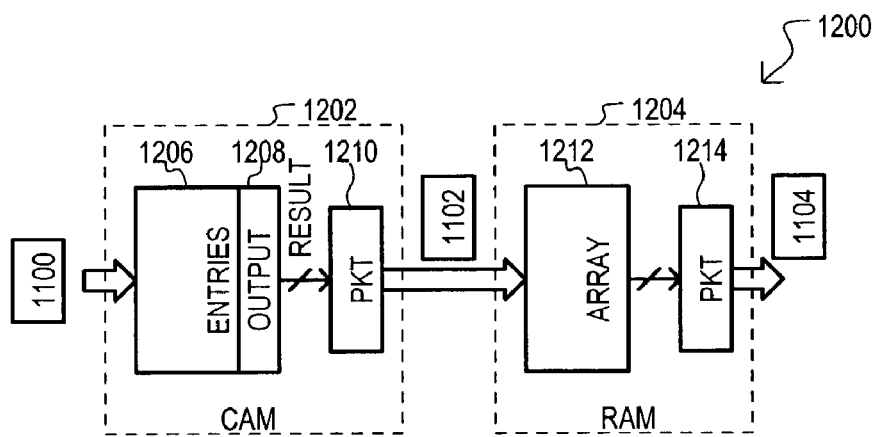
FIG. 12 is a block diagram of a search engine system that may receive requests and generate responses like those of FIGS. 11A to 11C.

Referring now to FIG. 12, a system that may receive requests and generate responses like those shown in FIGS. 11A to 11C is set forth in a block diagram and designated by the general reference character 1200. A system 1200 may include a CAM device 1202 and a storage device, shown as a RAM device 1204.

A CAM device 1202 may include CAM entries and associated circuits 1206, an output circuit 1208, and a packetizing circuit 1210. CAM entries and associated circuits 1206 may include CAM entries that store data for comparison with a key value, or the like. Associated circuits may include conventional CAM circuits, including but not limited to priority encoders and multiple match detect circuits. An output circuit 1208 may store result data for association with at least one portion of the CAM arrays. Such data may be output with predetermined results, such as a single match and/or multiple match. Preferably, an output circuit 1208 may store and output a memory address that may be included in a field ADDRESS of a CAM response like that of FIG. 11B.

A packetizing circuit 1210 may output result data in a predetermined format. As but one example, a packetizing circuit 1210 may include predetermined packet data values that may accompany all output responses. Such predetermined data may include data for a target field (e.g., TARGET in FIG. 11B) that indicates a response and indicates a RAM destination for a request, for a device field (e.g., DEVICE in FIG. 11B) that identifies CAM device 1202, and for a command field (e.g., CMD in FIG. 1B) that specifies an operation for RAM device 1204.

The above described predetermined packet data values may occupy locations within a memory portion of packetizing circuit 1210. Result data from an output circuit 1208 may be stored in other corresponding locations of a memory portion in packetizing circuit 1210. From predetermined packet data and result data, a packet size value can be determined. Such a packet size value can form a portion of code field (e.g., CODE in FIG. 11B) data.

A packetizer may then output such data from a memory portion to thereby transmit a response packet.

A RAM device may include an array and associated circuits 1212 and a RAM packetizer circuit 1214. An array and associated circuits 1212 may include RAM entries that store associated data. In addition, an array and associated circuits 1212 may include conventional RAM circuits for reading and writing data values. In addition, such circuits may also include decoder circuits for decoding command information from a response packet (e.g., CMD' in FIG. 11B). In one very particular arrangement, a memory address for a RAM device may include data from an address field of a response packet (e.g., ADDRESS of FIG. 11B) as more significant bits, and data from an index field of a response packet (e.g., INDEX of FIG. 11B) as less significant bits.

A packetizing circuit 1214 may operate in a similar fashion to packetizer circuit 1210 of CAM device 1202. However, such a circuit may add tag data from array and associated circuits 1212 to an output RAM response packet (e.g., FIG. 11C).

FIG. 12 also shows a request packet 1100 that may be received by a CAM device 1202. A request packet 1100 may have the same general format as that shown in FIG. 11A. FIG. 12 also shows a response packet 1102 that may be generated by a CAM device 1202, and a response packet 1104 that may be generated by a RAM device 1204. Response packets 1102 and 1104 may have the same general format as that shown in FIG. 11B and 11C, respectively.

In this way, in addition to extracting multiple match results, an explore operation can also access data associated with such matching results that is stored on a separate memory device.

Referring back to FIGS. 2A to 2C, it will be recalled that in one particular approach, a CAM device 200 may include an enable circuit 202 that may selectively activate entries in a CAM device.

Figure 13:
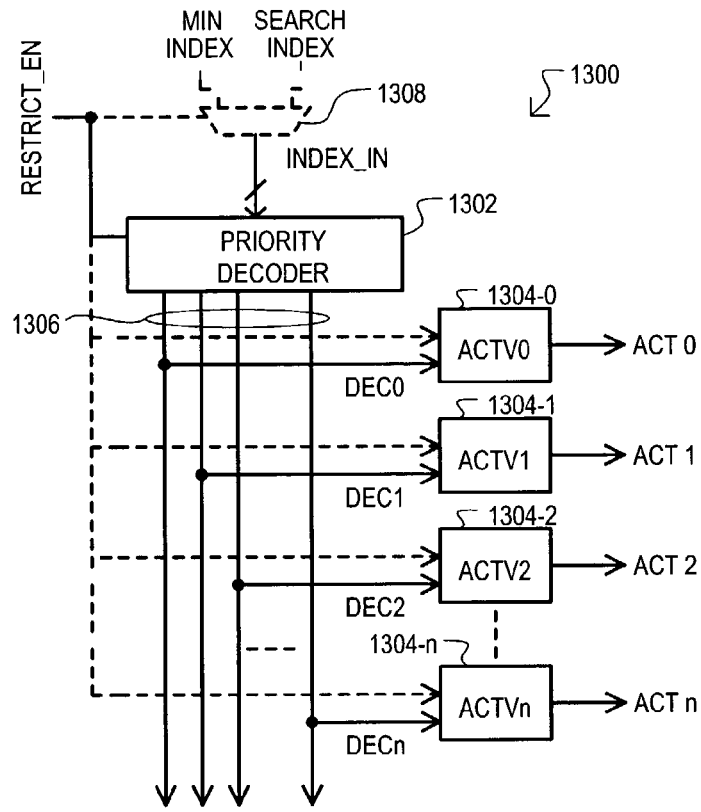
FIG. 13 is a block diagram showing an enable circuit according to an embodiment.

One particular example of an enable circuit, like that shown in FIG. 2, is represented in FIG. 13, and designated by the general reference character 1300. An enable circuit 1300 may include a priority decoder 1302 and a number of activation circuits 1304-0 to 1304-n. A priority decoder 1302 may receive an input index value INDEX_IN and a restricted search enable signal RESTRICT_EN and output a number of decoder signals DEC0 to DECn on decoder lines 1306.

Each activation circuit (1304-0 to 1304-n) may receive a decoder signal and provide an activation signal (ACT0 to ACTn) as an output. An activation signal (ACT0 to ACTn) can enable or disable a corresponding CAM entry.

A priority decoder 1302 may be enabled or disabled according to a restricted search enable signal RESTRICT_EN. For example, if a priority decoder 1302 is disabled, it may output decoder signals (DEC0 to DECn) that enable all activation circuits (1304-0 to 1304-n) without regard to a particular input index values INDEX IN. In contrast, when enabled, priority decoder 1302 may decode each input index values INDEX_IN into a predetermined decoder signals (DEC0 to DECn). More particularly, a priority decoder 1302 may decode index values INDEX_IN to activate and deactivate decoder signals (DEC0 to DECn) to thereby enable a restricted search in CAM device.

FIG. 13 shows two alternative approaches to disabling a priority decoder. In a first approach, restricted search enable signal RESTRICT EN may be received directly by a priority decoder 1302. Thus, circuits internal to a priority decoder 1302 may ensure the appropriate decoder signals (DEC0 to DECn) are generated. An alternative approach is shown in FIG. 13 by dashed lines. In an alternative approach, a "minimum" index value MIN INDEX may be applied. Such an index value may decode to generate appropriate decoder signals (DEC0 to DECn) for a disabled state.

Having described an example of an enable circuit, an example of an activation circuit that may included in an enable circuit will now be described with reference to FIG. 14A.

Figure 14A:
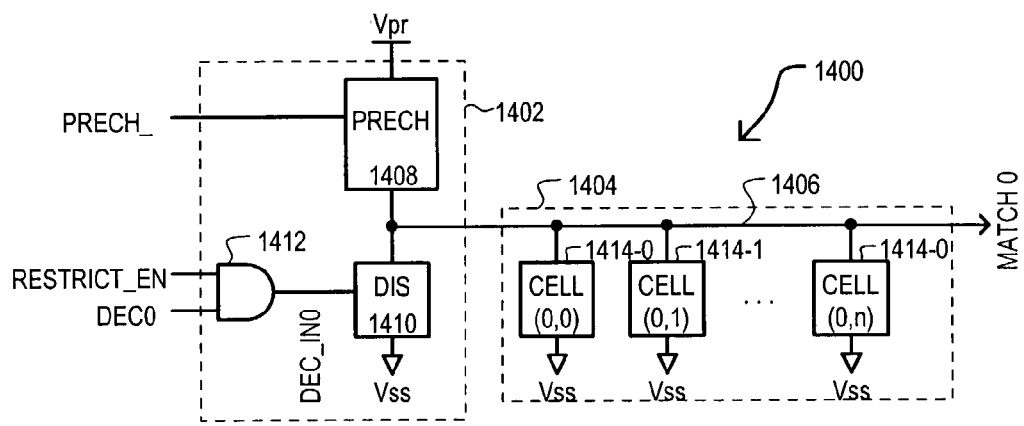
FIG. 14A shows an activation circuit that may be included in an enable circuit of an embodiment.

Referring now to FIG. 14A, an example of an activation circuit and a corresponding entry are set forth and designated by the general reference number 1400. FIG. 14A shows an activation circuit 1402 and an example of a corresponding CAM entry 1404. An activation circuit 1402 and a CAM entry 1404 may be commonly connected to a match line 1406. In the very particular example of FIG. 14A, an activation circuit 1402 may disable a match line 1406 by discharging the match line 1406. Match line 1406 may provide a match indication MATCH0.

In FIG. 14A an activation circuit 1402 can include a precharge circuit 1408 and a discharge circuit 1410. A precharge circuit 1408 may enable a path between a match line 1406 and a precharge potential in response to a precharge signal PRECH_. For example, if a precharge enable signal PRECH_is low, a match line 1406 may be placed substantially to a precharge potential (Vpr). In this way, a match line 1406 may be precharged to a potential prior to a search operation.

It is understood that match lines for a group of CAM entries may be simultaneously precharged to a precharge potential.

A discharge circuit 1410 may be situated between a match line (MATCH0) and a first potential (Vss). A discharge circuit 1410 may enable a path between a match line 1406 and a first potential in response to a decoder input signal DEC_IN0. Depending upon whether an input decode signal DEC_IN0 is active or not, a match line 1406 may be placed at a first potential. In particular, if an input decode signal DEC_IN0 is inactive, a match line 1406 may remain at a precharge potential. On the contrary, if an input decode signal DEC_IN0 is active, a match line 1406 may be placed at a first potential (Vss).

FIG. 14A also shows one of the many possible approaches to disabling a priority decoder. In FIG. 14A, an AND-type gate 1412 may receive a decoder signal DEC0 and a restricted search enable signal RESTRICT_EN. In the event a restricted search enable signal RESTRICT_EN is active, a discharge circuit 1410 can be enabled or disabled according to decoder signal DEC0. If a restricted search enable signal RESTRICT_EN is not active, a discharge circuit 1410 can be disabled, regardless of a corresponding decoder signal DEC0.

Figures 14B, 15:
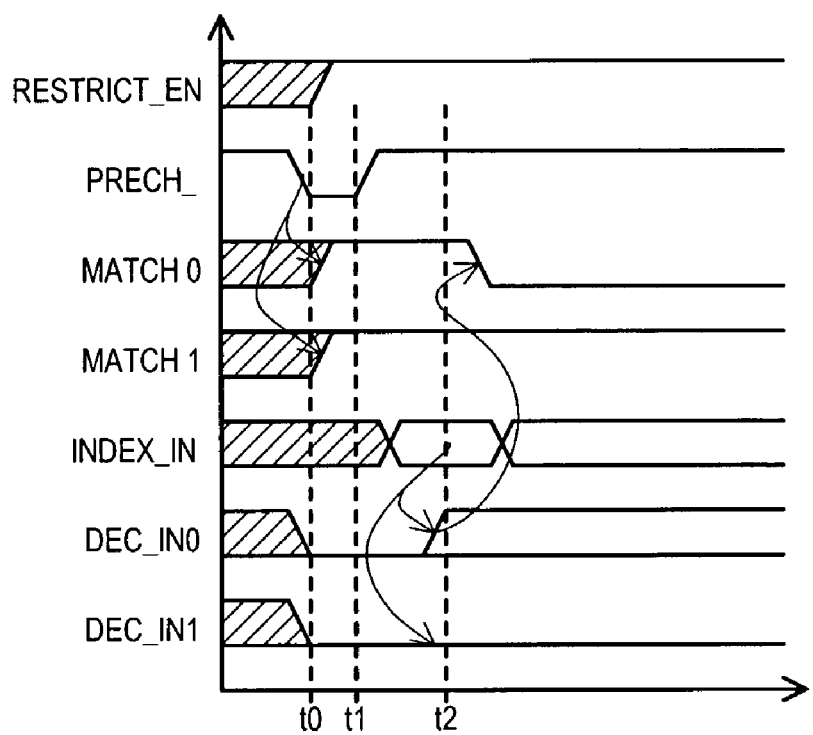
FIG. 14B is a timing diagram showing the operation of the activation circuit of FIG. 14A.
FIG. 15 is a table illustrating the operation of a priority decoder that may be included in an enable circuit of an embodiment.

FIG. 14B is a timing diagram showing one example of the operation of a CAM device that includes an activation circuit and entry like that of FIG. 14A. FIG. 14B shows some of the signals illustrated in FIG. 14A, including a precharge enable signal PRECH_, a restricted search enable signal RESTRICT_EN, an input decode signal DEC_IN0, and a match indication MATCH0.

Also included in FIG. 14B are signals corresponding to a second entry, including an input decode signal DEC_IN1 and a match indication MATCH1, as well as a representation of an input index value INDEX_IN.

The particular example of FIG. 14B illustrates a restricted search operation in which an applied search key matches two entries (entries 0 and 1), but an input index value INDEX_IN restricts such a search to a space that includes entry 1 but excludes entry 0.

Referring to FIG. 14B at time t0, a precharge enable signal PRECH_may be activated (transition low in this case). In response to such a transitions, precharge circuits within activation circuits may be enabled, and match indications for entries in a CAM device may be precharged. Thus, FIG. 14B shows match indications (MATCH0 and MATCH1) being set to a precharge potential (high in this example).

Also at time t0, decode input signals DEC0 and DEC1 may be inactive (low in the example).

At time $t_1$, a precharge enable signal may be de-activated (transition high in this case). In response to such a transitions, precharge circuits within activation circuits may be disabled, however, match indications (MATCH0 and MATCH1) can remain precharged.

At time t2, an input index value INDEX_IN may be received. A priority decoder may activate an input decode signal. In addition, restricted search enable signal RESTRICT_EN may be active (high in this case), indicating a priority decoder may be enabled. A priority decoder may decode input index value INDEX_IN. In the example of FIG. 14B, such a decoding can result in input decode signal DEC_IN0 being activated while input decode signal DEC_IN1 is deactivated.

The activation of input decode signal DEC_IN0 can result in a discharge circuit for entry 0 being enabled, causing match indication MATCH0 to be discharged (transition low in this example).

In contrast, the de-activation of input signal DEC_IN1 can result in a discharge circuit for entry 1 being disabled, causing match indication MATCH1 to remain precharged. Of course it is understood that if an applied search key did not match values in entry 1, match indication MATCH1 could be discharged, by CAM cells of the entry, for example.

Having described very particular examples of enable circuits, particular approaches to a priority decoder will now be described.

Referring now to FIG. 15, one example of the operation of a priority decoder is set forth in a table. FIG. 15 includes two column sets. An INDEX_IN column set shows various three-bit input index values, I2, I1, and I0. As shown, a lower input index value may correspond to a higher priority. Column set DEC0 to DEC7 show various decoder signals that may be generated in response to particular index values I2–I0. It is assumed that each decoder signal may enable a particular entry when inactive (low in this example) and disable an entry when active (high in this example). That is, a CAM entry "entry 0" can be enabled or disabled according to decoder signal DEC0, a next lower priority CAM entry "entry 1" can be enabled or disabled according to decoder signal DEC1, etc. Thus, decoder signals DEC0 to DEC7 can be considered to have a priority with respect to one another that can follow a priority of their respective entries. Accordingly, in FIG. 15, decoder signal DEC0 has a highest priority, while decoder signal DEC7 has a lowest priority.

As shown in FIG. 15, in response to an index value of "000," decoder signal DEC0 may be active, disabling CAM entry 0. At the same time, remaining decoder signals DEC1 to DEC7 may be inactive, enabling the remaining CAM entries. Similarly, in response to an index value of "011," decoder signal DEC3 and the decoder signals for all higher priority entries (DEC0 to DEC2) may be active, disabling CAM entries 0–3. At the same time, the remaining lower priority decoder signals DEC4 to DEC7 may be inactive, enabling remaining lower priority CAM entries.

Of course, while FIG. 15 sets forth an eight-bit example, larger bit examples would be obvious to those skilled in the art.

In this way, a priority decoder may decode an input index value into predetermined decoder signals that may selectively restrict a search operation for corresponding CAM entries.

Figure 16:
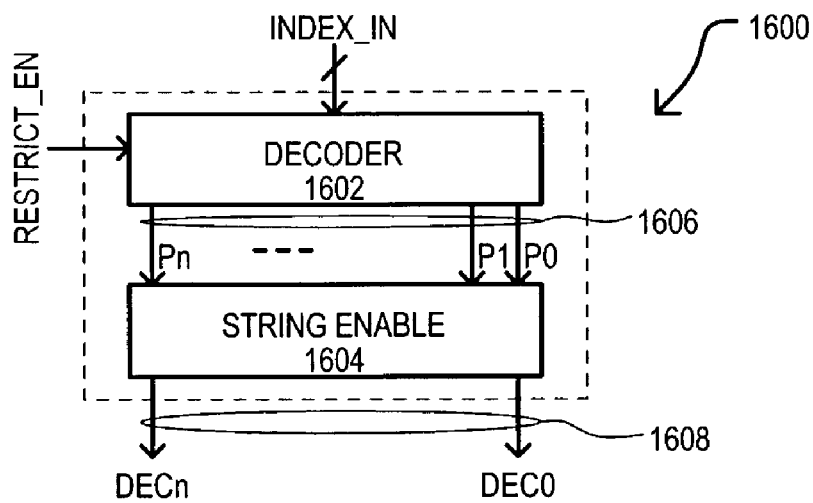
FIG. 16 is a block diagram showing one example of a priority decoder according to an embodiment.

Referring now to FIG. 16, an example of a priority decoder according to an embodiment is set forth and designated by the general reference number 1600. A priority decoder 1600 may include a decoder 1602 and a string enable circuit 1604. A decoder may receive an input index value INDEX_IN and provide output signals P0 to Pn on output lines 1606. A string enable circuit 1604 may receive decoder output signals P0 to Pn and provide decoder signals DEC0 to DECn decoder lines 1608.

A decoder 1602 may be a conventional decoder that activates a single output signal (P0 to Pn) in response to different input index values INDEX_IN. As but one very particular example, an input index value INDEX_IN of "0" could activate only output signal P0, an input index value INDEX_IN of "1" could activate only output signal PI, etc.

A string enable circuit 1604 can activate groups of decoder signals DEC0 to DECn according to which particular output signal (P0 to Pn) is active. As but one very particular example, to generate a response like that of FIG. 15, a string enable circuit 1604 may activate decoder signals DEC0 to DECn that are equal to or less than an activated output signal (P0 to Pn), and deactivate decoder signals DEC0 to DECn that are greater than an activated output signal (P0 to Pn).

Figure 17:
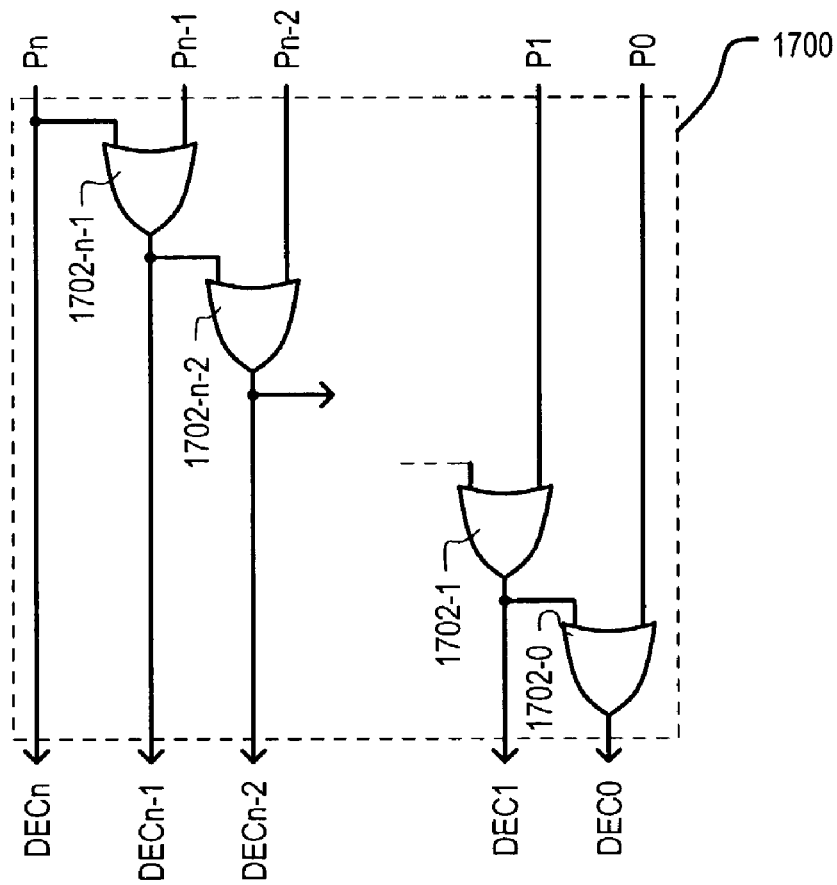
FIG. 17 is a schematic diagram of a string enable circuit according to an embodiment.

One very particular example of a string enable circuit is shown in FIG. 17 and designated by the general reference character 1700. A string enable circuit 1700 may include a number of logic gates (1702-0 to 1702-n-1) that may enable and/or disable a sequential group of decoder signals (DEC0 to DECn) according to a single activated output signal (P0 to Pn).

Of course, FIGS. 16 and 17 show but one of the many possible approaches to generating a responses like that of FIG. 15, and should not be construed as limiting the invention thereto. As but one example, a priority decoder may directly encode index values according to the general scheme set forth in FIG. 15, and thus not necessarily include a "one-hot" type decoder like that shown in FIG. 16.

It will be recalled that a restricted search in a given portion (e.g., sub-block or memory section) of a CAM device may be enabled or disabled according to predetermined criteria. For example, in the operations shown in FIGS. 7A to 7E and 8A to 8B, searches in a sub-block of a CAM device may be selected according to a priority value of a sub-block (which may be programmable) and a sub-block number (which may be fixed and/or different for each sub-block).

Figure 18:
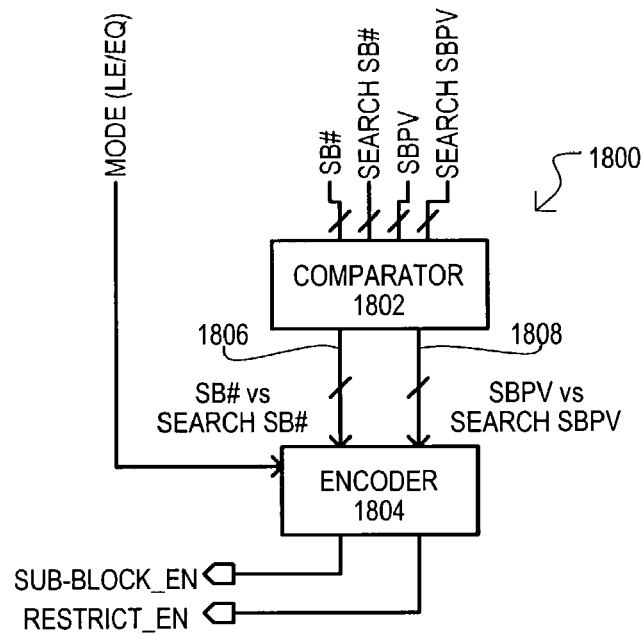
FIG. 18 is a block schematic diagram of a feature compare circuit according to an embodiment.

Referring now to FIG. 18, one example of a feature compare circuit is set forth in a block schematic diagram and designated by the general reference character 1800. A feature compare circuit 1800 may compare predetermined feature values associated with a sub-block, to those dictated by a command (e.g., explore or "search beyond"). According to such a comparison a feature compare circuit can indicate if a restricted search can be performed in a sub-block. Additionally, a feature compare circuit 1800 can indicate if an unrestricted search can be performed in the sub-block and/or if a search can be prohibited in the sub-block.

The particular example of FIG. 18 shows a feature compare circuit 1800 that includes a comparator portion 1802 and a result encoder 1804. A comparator portion 1802 may compare a sub-block number SB# with a search sub-block number SEARCH SB# and provide results for such a comparison "SB# vs SEARCH SB#" on block result lines 1806. Similarly, a comparator portion 1802 can compare a sub-block priority value SBPV with a search priority value SEARCH SBPV and provide results for such a comparison "SBPV vs SEARCH SBPV" on priority result lines 1808.

A result encoder 1804 can receive various comparison result values ("SB# vs SEARCH SB#" and "SBPV vs SEARCH SBPV") as well as a mode indication MODE(LE/EQ). Various combinations of such input values can be encoded into sub-block operation values.

The particular example of FIG. 18 shows two sub-block operation values, a sub-block enable signal SUB-BLOCK_EN and a restricted search enable signal RESTRICT_EN. A sub-block enable signal SUB-BLOCK_EN can enable search operations in a sub-block, whether such operations are restricted or unrestricted. A restricted search enable signal RESTRICT EN can indicate if an enabled sub-block undergoes a restricted search or an unrestricted search.

Figures 19A, 19B:
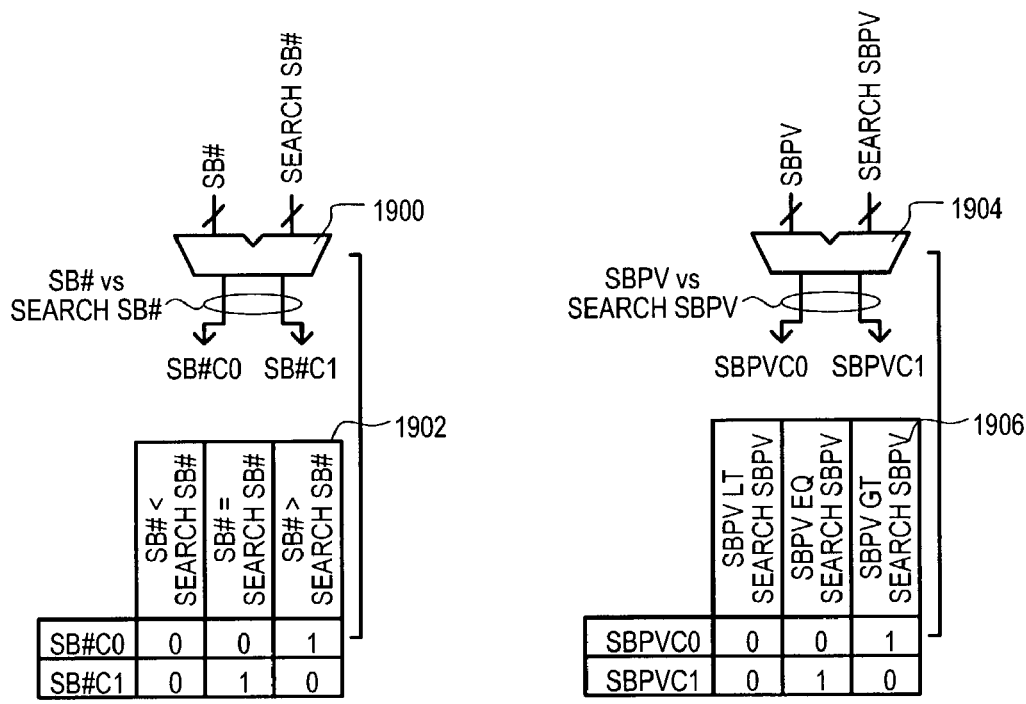
FIGS. 19A and 19B are block schematic diagrams comparator circuits that may be included in a feature compare circuit according to an embodiment.

Referring now to FIGS. 19A and 19B, examples of comparator circuits that may be included in a comparator portion 1802 are shown in schematic diagrams. FIG. 19A shows a comparator circuit 1900 that may receive a sub-block number SB# and a search sub-block number SEARCH SB#. A comparison result between such values may be output as two sub-block number result signals shown as SB#C0 and SB#C1. Sub-block number result signals SB#C0 and SB#C1 may indicate at least three possible compare results: a sub-block number is less than a search sub-block number SB#<SEARCH SB#, a sub-block number is equal to a search sub-block number SB#=SEARCH SB#, or a sub-block number is greater than a search sub-block number SB#<SEARCH SB#.

A comparator circuit 1900 may be a conventional multi-bit magnitude comparator circuit.

FIG. 19A also includes a truth table 1902 showing a comparator circuit 1900 response. The particular table of FIG. 19A shows one way to implement the same general response described in FIGS. 7A to 7E and 8A to 8B.

FIG. 19B shows a comparator circuit 1904 that may receive a sub-block priority value SBPV and a search priority value SEARCH SBPV. A comparison result between such values may be output as two priority result signals shown as SBPVC0 and SBPV1. Sub-block priority result signals SBPV0 and SBPVC1 may indicate at least three possible compare results: a sub-block priority is less than a search priority SBPV LT SEARCH SBPV, a sub-block priority is equal to a search priority SBPV EQ SEARCH SBPV, a sub-block priority is higher than a search priority SBPV GT SEARCH SBPV.

Like FIG. 19A, a comparator circuit 1904 of FIG. 19B may be a conventional multi-bit magnitude comparator circuit.

FIG. 19B also includes a truth table 1906 showing a comparator circuit 1904 response. The particular table of FIG. 19B can reflect one way to implement the same general response described in FIGS. 7A to 7E and 8A to 8B.

Figure 20:
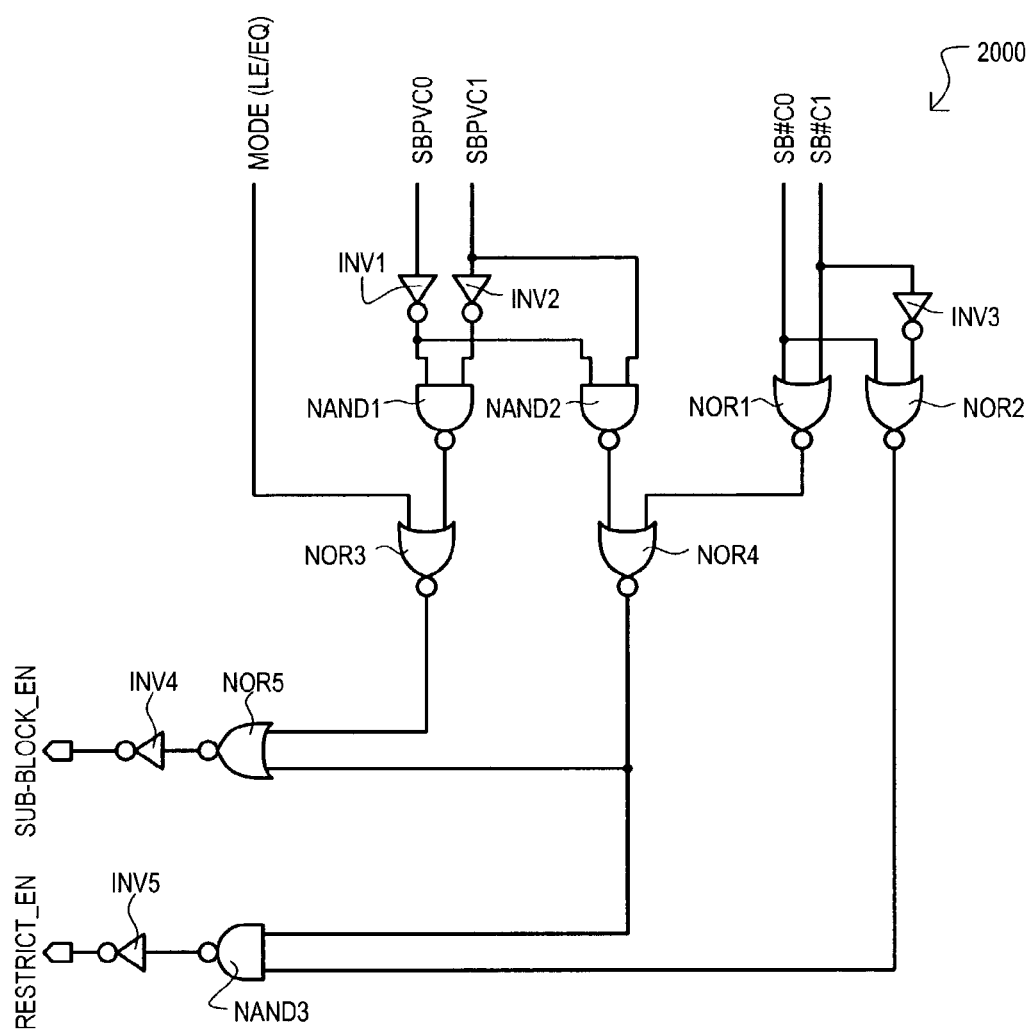
FIG. 20 is a schematic diagram of a feature decoder circuit that may be included in a feature compare circuit according to an embodiment.
Figure 21A:
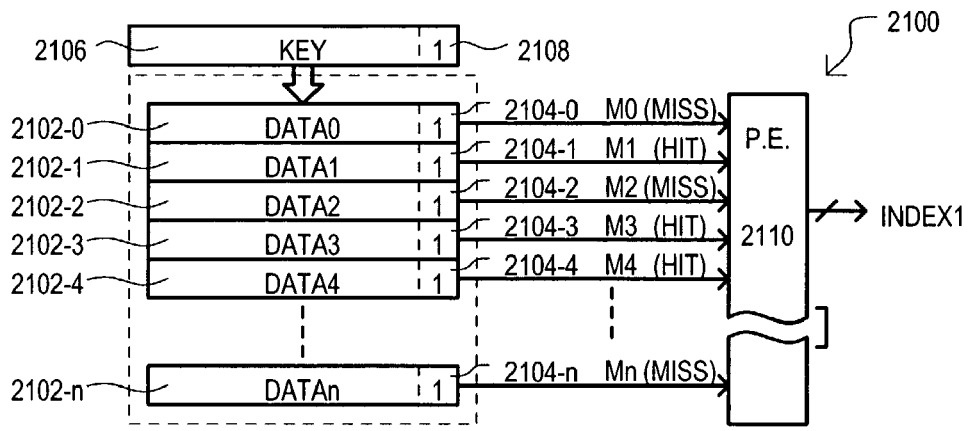
FIGS. 21A to 21C are block diagrams showing a conventional operation of a CAM device.
Figure 21B:
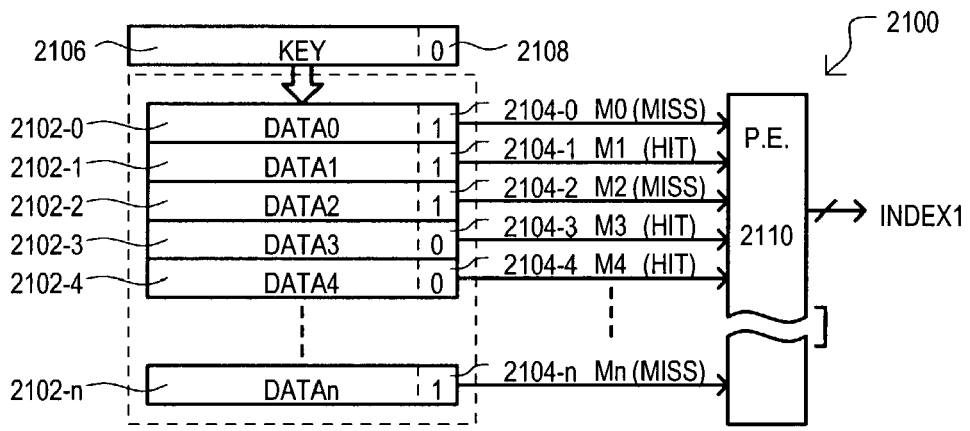
Figure 21C:
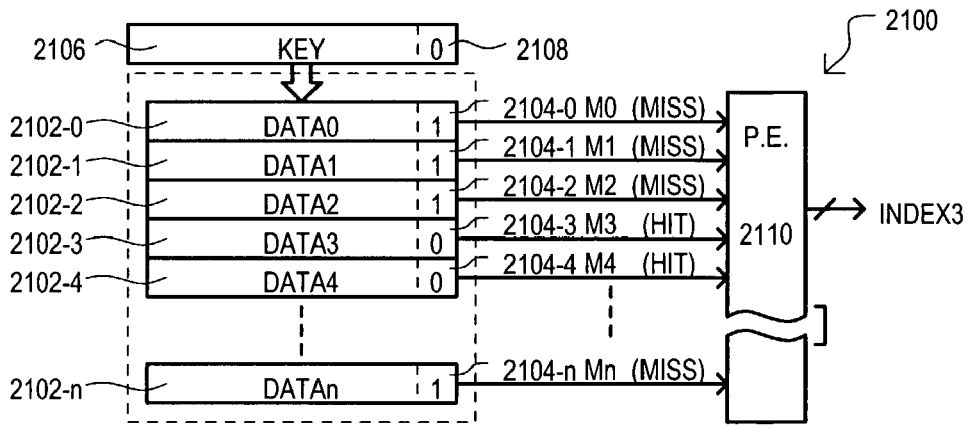

Referring now to FIG. 20, one very particular example of a result encoder, like that shown as 1804 in FIG. 18, is shown in a schematic diagram and designated by the general reference character 2000. A result encoder 2000 may receive sub-block number result signals shown as SB#C0 and SB#C1 as well as sub-block priority result signals shown as SBPVC0 and SBPVC1. In addition, a result encoder 2000 may receive a mode value MODE (LE/EQ).

Sub-block number result signals SB#C0 and SB#C1 can follow the responses shown in FIG. 19A, while sub-block priority result signals can follow the responses shown in FIG. 19B. A mode value MODE (LE/EQ) may have one value (in this example low) that indicates an explore less-than-or-equal-to operation, like that represented in FIGS. 7A to 7C and 8A. In addition, a mode value MODE (LE/EQ) may have another value (in this example high) that indicates an explore equal-to operation, like that represented in FIGS. 7D, 7E and 8B.

A result encoder 2000 may include an inverter INV1 that receives sub-block priority result signal SBPVC0 at an input and has an output connected to an input of gates NAND1 and NAND2. A sub-block priority result signal SBPVC1 may be supplied to an input of gate NAND2, and to an input of gate NAND1 by way of an inverter INV2.

Sub-block number result signal SB#C0 can be provided to an input of gates NOR1 and NOR2. A sub-block number result signal SB#C1 can be provided to another input of gate NOR1, and to an input of gate NOR2 by way of inverter INV3.

Gate NAND1 may have an output connected to an input of gate NOR3. Another input of gate NOR3 may receive a mode value MODE (LE/EQ). Gate NAND2 may have an output connected to an input of gate NOR4. Another input of gate NOR4 may be connected to an output of gate NOR 1.

A result encoder 2000 may also include a gate NOR5 that has one input connected to the output of gate NOR3 and another input connected to the output of gate NOR4. An output of gate NOR5 may be inverted by an inverter INV4 to generate a sub-block enable signal SUB-BLOCK_EN.

A result encoder 2000 may further include a gate NAND3 that has one input connected to the output of gate NOR4 and another input connected to the output of gate NOR2. The output of gates NAND3 may be inverted by inverter INV5 to generate a restricted search enable signal RESTRICT_EN.

The operation of result encoder 2000 will now be described.

It will first be assumed that a mode value MODE (LE/EQ) is low, indicating response like that represented in FIG. 8A (e.g., EXPLORE_LE).

If a sub-block priority is less than search priority, sub-block priority result signal SBPVC0 and SBPVC1 can both be low. Such value may be inverted by inverters INV1 and INV2, respectively, causing an output of gate NAND1 to be low. With the output of gate NAND1 low an output of gate NOR3 can be forced high. This can result in a high value being applied to an input of gate NOR5. With a high value at an input of gate NOR5, a sub-block enable signal SUB-BLOCK_EN can be set high.

From FIG. 20, it can be shown that in an EXPLORE_LE operation, if a sub-block priority is equal to a search priority, sub-block priority result signal SBPVC0 can be low, while sub-block priority result signal SBPVC1 can be high. Such values can result in an output of gate NOR3 being low, while an output of gate NOR4 may vary according to a sub-block number comparison.

In particular, if a sub-block number is less than a search sub-block number, search number sub-block number signals SB#C0 and SB#C1 can both be low. This can result in an output of gate NOR4 being low. Thus, inputs to gate NOR5 can both be low, resulting in a low sub-block enable signal SUB-BLOCK_EN. Thus, a sub-block having a smaller number than a search sub-block number, and equal priority, can be excluded from a search operation.

If a sub-block number is equal to a search sub-block number, a search sub-block number signal SB#C0 can be low while a search sub-block number signal SB#C1 can be high. This can result in an output of gates NOR4 and NOR 2 being high. A high output from gate NOR4 can force sub-block enable signal SUB-BLOCK_EN high. In addition, high outputs from gates NOR4 and NOR2 may force restricted search enable signal RESTRICT_EN to a high state. Thus, a sub-block having a number equal to a search sub-block number, and an equal priority, can be subject to a restricted search operation.

If a sub-block number is greater than a search sub-block number, a search sub-block number signal SB#C0 can be high while a search sub-block number signal SB#C1 can be low. This can result in an output of gate NOR4 being high and NOR 2 being low. A high output from gate NOR4 can force sub-block enable signal SUB-BLOCK_EN high, while a low output from gate NOR2 can result in restricted search enable signal RESTRICT_EN being low. Thus, a sub-block having a greater number to a search sub-block number, and equal priority, can be subject to an unrestricted search operation.

From FIG. 20, it can be shown that in an EXPLORE_LE operation, if a sub-block priority is greater than a search priority, sub-block priority result signal SBPVC0 can be high, while sub-block priority result signal SBPVC1 can be low. Such values can result in outputs of gates NOR3 and NOR4 being low. This can force sub-block enable signal SUB-BLOCK_EN low. Thus, a sub-block having a higher priority than a search priority may be excluded from a search operation, regardless of the sub-block number.

Referring still to FIG. 20, It will now be assumed that a mode value MODE (LE/EQ) is high, indicating response like that represented in FIG. 8B (e.g., EXPLORE_EQ).

If a sub-block priority is less than search priority, sub-block priority result signals SBPVC0 and SBPVC1 can both be low. Such values may result in outputs of gates NOR3 and NOR4 both being low. This can force sub-block enable signal SUB-BLOCK_EN low. Thus, in an EXPLORE EQ operation, if a sub-block priority is less than a search priority, the sub-block may be excluded from a search operation.

If a sub-block priority is equal to a search priority, sub-block priority result signal SBPVC0 can be low, while sub-block priority result signal SBPVC1 can be high. Such values may result in an output of gate NOR3 being low and an output of gate NAND2 being low. Thus, whether an unrestricted or restricted search occurs may depend upon sub-block number result signals SB#C0 and SB#C1.

In particular, if a sub-block number is less than a search sub-block number, search number sub-block number result signals SB#C0 and SB#C1 can both be low. This can result in an output of gate NOR4 being low, resulting in a low sub-block enable signal SUB-BLOCK_EN. Thus, a sub-block having a smaller number than a search sub-block number, and equal priority, can be excluded from a search operation regardless of sub-block number value.

If a sub-block number is equal to a search sub-block number, a search sub-block number result signal SB#C0 can be low while a search sub-block number result signal SB#C1 can be high. This can result in an output of gates NOR4 and NOR 2 being high. A high output from gate NOR4 can force sub-block enable signal SUB-BLOCK_EN high. In addition, high outputs from gates NOR4 and NOR2 may force restricted search enable signal RESTRICT_EN to a high state. Thus, a sub-block having a number equal to a search sub-block number, and equal priority, can be subject to a restricted search operation.

If a sub-block number is greater than a search sub-block number, a search sub-block number result signal SB#C0 can be high while a search sub-block number result signal SB#C1 can be low. This can result in an output of gate NOR4 being high and NOR 2 being low. A high output from gate NOR4 can force sub-block enable signal SUB-BLOCK_EN high, while a low output from gate NOR2 can result in restricted search enable signal RESTRICT_EN being low. Thus, a sub-block having a greater number than a search sub-block number, and equal priority, can be subject to an unrestricted search operation.

Finally, if a sub-block priority is greater than a search priority, sub-block priority result signal SBPVC0 can be high, while sub-block priority result signal SBPV1 can be low. With mode signal MODE(LE/EQ) high, such values may result, in outputs of gates NOR3 and NOR4 both being low. This can force sub-block enable signal SUB-BLOCK_EN low. Thus, in an EXPLORE_EQ operation, if a sub-block priority is greater than a search priority, the sub-block may be excluded from a search operation, regardless of sub-block number value.

Of course, FIG. 20 is but one very particular example illustrating an approach to enabling restricted and unrestricted searches according to priority and sub-block number values. Different logic configurations to arrive at an essentially same result would be obvious to one skilled in the art. Accordingly, FIG. 20 should not be construed as limiting the invention to such a very particular approach.

Thus, while the embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. In a content addressable memory (CAM) device having a plurality of CAM entries, a search method, comprising the steps of:
   searching at least one portion of the CAM entries according to a CAM entry identifier that distinguishes the at least one portion of the CAM entries from another different portion of the CAM entries, the CAM entry identifier corresponding to a CAM entry having a data value that matched a search key value in a previous search operation;
   generating match results for entries in the at least one portion that match an applied search key value; and
   searching a second portion of the CAM entries that has fewer entries than the at least one portion of the CAM entries, the second portion being determined according to a highest priority match result from the generated match results.

2. The search method of claim 1, wherein:
   the CAM entry identifier comprises a search index value corresponding to a CAM entry.

3. The search method of claim 2, wherein:
   searching the at least one portion includes searching with a search key value that is compared to data values in the CAM entries.

4. The search method of claim 2, wherein:
   the portions of the CAM entries include a first portion having corresponding index values that are of a higher priority than the search index value, and a second portion with corresponding index values that are of a lower priority than the search index value.

5. The search method of claim 1, wherein:
   searching the at least one portion of the CAM entries further includes:
      comparing a search information value with a section information value associated with the at least one portion of the CAM entries to generate an enable result, and
      searching the at least one portion with a search key value when the enable result has a predetermined value.

6. The search method of claim 5, wherein:
   the enable result is selected from the group consisting of: equal to, less than, greater than, less than or equal to, or greater than or equal to.

7. The search method of claim 5, wherein;
   the search information value includes a search priority value and the section information value includes a programmable priority value that indicates a priority of the at least one portion with respect to other portions of the CAM entries.

8. The search method of claim 7, wherein:
   the search information value further includes a search number value and the section information value further includes a section number value that is different for each portion of the CAM entries.

9. The search method of claim 1, further including:
   the entries of the at least one portion of the CAM having a priority with respect to one another; and
   generating a new CAM entry identifier that corresponds to a highest priority matching entry in the at least one portion of CAM entries.

10. A content addressable memory (CAM) device, comprising:
   an entry disable circuit coupled to a plurality of CAM entries that selectively disables a portion of the CAM entries according to an entry identifier corresponding to one of the CAM entries, the entry disable circuit providing an enable signal to each CAM entry and further including a string decoder that deactivates enable signals for one portion of the CAM entries and activates the enable signals for a different portion of the CAM entries according to an activated address line; and
   a priority encoder that generates an index value for a highest priority enabled CAM entry having data that matches an applied search key.

11. The CAM device of claim 10, wherein:

the entry identifier corresponds to one of the index values.

12. The CAM device of claim 10, wherein:

each CAM entry is accessible according to a CAM address;

the entry identifier comprises one of the CAM addresses; and the entry disable circuit includes a CAM address decoder that activates different predetermined address lines in response to each CAM address.

13. The CAM device of claim 10, further including:

an enable circuit that compares a section value associated with the plurality of CAM entries to a search related value to generate an enable result.

* * * * *